United States Patent
Okada et al.

(10) Patent No.: US 10,989,994 B2
(45) Date of Patent: Apr. 27, 2021

(54) PROJECTOR HAVING A REFRIGERANT GENERATOR

(71) Applicant: SEIKO EPSON CORPORATION, Tokyo (JP)

(72) Inventors: Naoya Okada, Shiojiri (JP); Nobuo Sugiyama, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/802,996

(22) Filed: Feb. 27, 2020

(65) Prior Publication Data
US 2020/0278598 A1 Sep. 3, 2020

(30) Foreign Application Priority Data
Feb. 28, 2019 (JP) .............................. JP2019-036028

(51) Int. Cl.
*G03B 21/16* (2006.01)
*H05K 7/20* (2006.01)

(52) U.S. Cl.
CPC ......... *G03B 21/16* (2013.01); *H05K 7/20145* (2013.01); *H05K 7/20154* (2013.01); *H05K 7/20172* (2013.01)

(58) Field of Classification Search
CPC .... G03B 21/006; G03B 21/008; G03B 21/16; G03B 21/28; G03B 21/2013; G03B 21/2033; H05K 7/20; H05K 7/20145; H05K 7/20154; H05K 7/20172; F28D 15/00; F28D 15/02; F28D 15/04; F28D 15/208;
(Continued)

(56) References Cited

U.S. PATENT DOCUMENTS

| 8,517,540 | B2 | 8/2013 | Terao |
| 2010/0132379 | A1 | 6/2010 | Wu et al. |
| 2011/0037954 | A1 | 2/2011 | Tsuchiya et al. |

(Continued)

FOREIGN PATENT DOCUMENTS

| JP | H11-057383 A | 3/1999 |
| JP | H11-169644 A | 6/1999 |

(Continued)

*Primary Examiner* — Sultan Chowdhury
(74) *Attorney, Agent, or Firm* — Oliff PLC

(57) ABSTRACT

The projector includes a cooler cooling a cooling target based on transformation of a refrigerant into a gas. A refrigerant generator of the cooler includes a moisture absorption/desorption member, a first blower feeding air to the moisture absorption/desorption member, a first heat exchanger, a second blower circulating air inside a circulation channel passing through the first heat exchanger and the moisture absorption/desorption member, a second heat exchanger at least partially disposed in the circulation channel. The second heat exchanger includes a thermoelectric element, a first heat-transfer member coupled to a heat absorption surface of the thermoelectric element, and a second heat-transfer member thermally coupled to a heat dissipation surface of the thermoelectric element. The first heat-transfer member cools the air flowing through the circulation channel. The second heat-transfer member has a heat dissipation section configured to heat the air which was cooled by the first heat-transfer member.

11 Claims, 12 Drawing Sheets

(58) Field of Classification Search
CPC ............ F28D 15/0266; F28D 15/0283; H04N 9/3126; H04N 9/3141; H04N 9/3144
See application file for complete search history.

(56) References Cited

U.S. PATENT DOCUMENTS

| | | |
|---|---|---|
| 2011/0242499 A1 | 10/2011 | Terao |
| 2016/0147034 A1* | 5/2016 | Shoujiguchi ............ G02B 7/028 359/512 |
| 2019/0196311 A1 | 6/2019 | Sligiyama et al. |

FOREIGN PATENT DOCUMENTS

| | | |
|---|---|---|
| JP | 2002-107698 A | 4/2002 |
| JP | 2007-294655 A | 11/2007 |
| JP | 2009-222998 A | 10/2009 |
| JP | 2011-036768 A | 2/2011 |
| JP | 2011-215457 A | 10/2011 |
| JP | 2014-087797 A | 5/2014 |
| JP | 2019-117332 A | 7/2019 |

* cited by examiner

PROJECTOR HAVING A REFRIGERANT GENERATOR

The present application is based on, and claims priority from JP Application Serial Number 2019-036028, filed Feb. 28, 2019, the disclosure of which is hereby incorporated by reference herein in its entirety.

BACKGROUND

1. Technical Field

The present disclosure relates to a projector.

2. Related Art

As a device for cooling a projector, there are proposed such a cooler due to air cooling using a blower as described in, for example, JP-A-2002-107698, such a cooler due to liquid cooling using a pump for feeding a refrigerant liquid and a pipe for transmitting the refrigerant liquid as described in, for example, JP-A-2007-294655, and so on.

In recent years, due to an increase in luminance of projectors, an amount of heat of a cooling target to be cooled by a cooler increases, and an increase in cooling performance of the cooler is required. However, when increasing the cooling performance in the cooler using air cooling, liquid cooling, and so on, there is a problem that the cooler grows in size, and thus the projector grows in size. Further, in the case of air cooling, there is also a problem that the sound noise due to the blower increases.

SUMMARY

A projector according to an aspect of the present disclosure is a projector having a cooling target, including a light source device configured to emit light, an optical modulator for modulating light emitted from the light source device in accordance with an image signal, and a projection optical device configured to project the light modulated by the light modulator, and a cooler configured to cool the cooling target based on transformation of a refrigerant into a gas, wherein the cooler includes a refrigerant generator configured to generate the refrigerant, and a refrigerant sender configured to transmit the refrigerant generated toward the cooling target, the refrigerant generator includes a moisture absorption/desorption member which rotates, a first blower configured to feed air to a part of the moisture absorption/desorption member located in a first area, a first heat exchanger coupled to the refrigerant sender, a circulation channel passing through the first heat exchanger and a part of the moisture absorption/desorption member located in a second area different from the first area, a second blower configured to circulate air in the circulation channel, and a second heat exchanger at least partially disposed in a part where air passes from the first heat exchanger to the moisture absorption/desorption member in the circulation channel, the first heat exchanger is cooled to generate the refrigerant from the air flowed into the first heat exchanger, the second heat exchanger includes a thermoelectric element having a heat absorption surface and a heat dissipation surface, a first heat-transfer member thermally coupled to the heat absorption surface, and a second heat-transfer member thermally coupled to the heat dissipation surface, the first heat-transfer member cools the air flowing through the circulation channel to generate the refrigerant, and the second heat-transfer member has a heat dissipation section configured to heat air which was cooled by the first heat-transfer member.

The first heat-transfer member may have a heat absorption section configured to cool the air flowing through the circulation channel, and the heat absorption section may be disposed inside the first heat exchanger.

The first heat-transfer member may be a heatsink having a plurality of fins which is the heat absorption section.

The second heat-transfer member may be a heatsink having a plurality of fins which is the heat dissipation section.

The plurality of fins may be each shaped like a plate extending along a direction in which the air passes through the second heat exchanger inside the circulation channel.

The second heat exchanger may have a plurality of the thermoelectric elements.

The plurality of thermoelectric elements may be arranged along the direction in which the air passes through the second heat exchanger inside the circulation channel, and the first heat-transfer member may be disposed for each of the thermoelectric elements.

The second heat exchanger may include a first thermoelectric element and a second thermoelectric element which are disposed so as to sandwich the first heat-transfer member in a direction perpendicular to the direction in which the air passes through the second heat exchanger inside the circulation channel, and both of the heat absorption surface of the first thermoelectric element and the heat absorption surface of the second thermoelectric element may be thermally coupled to the first heat-transfer member sandwiched between the first thermoelectric element and the second thermoelectric element.

The refrigerant generator may have a heater disposed in a part where air flowing from the first heat exchanger to the moisture absorption/desorption member passes in the circulation channel, and the heater may further heat the air which was heated by the heat dissipation section.

The cooling target is the light modulator.

DESCRIPTION OF AN EXEMPLARY EMBODIMENT

A projector according to an embodiment of the present disclosure will hereinafter be described with reference to the accompanying drawings. It should be noted that the scope of the present disclosure is not limited to the embodiment hereinafter described, but can arbitrarily be modified within the technical idea or the technical concept of the present disclosure. Further, in the following drawings, in order to make each constituent easy to understand, each of the structures is made different from the actual structure in scale size, number, and so on in some cases.

Figure 1:
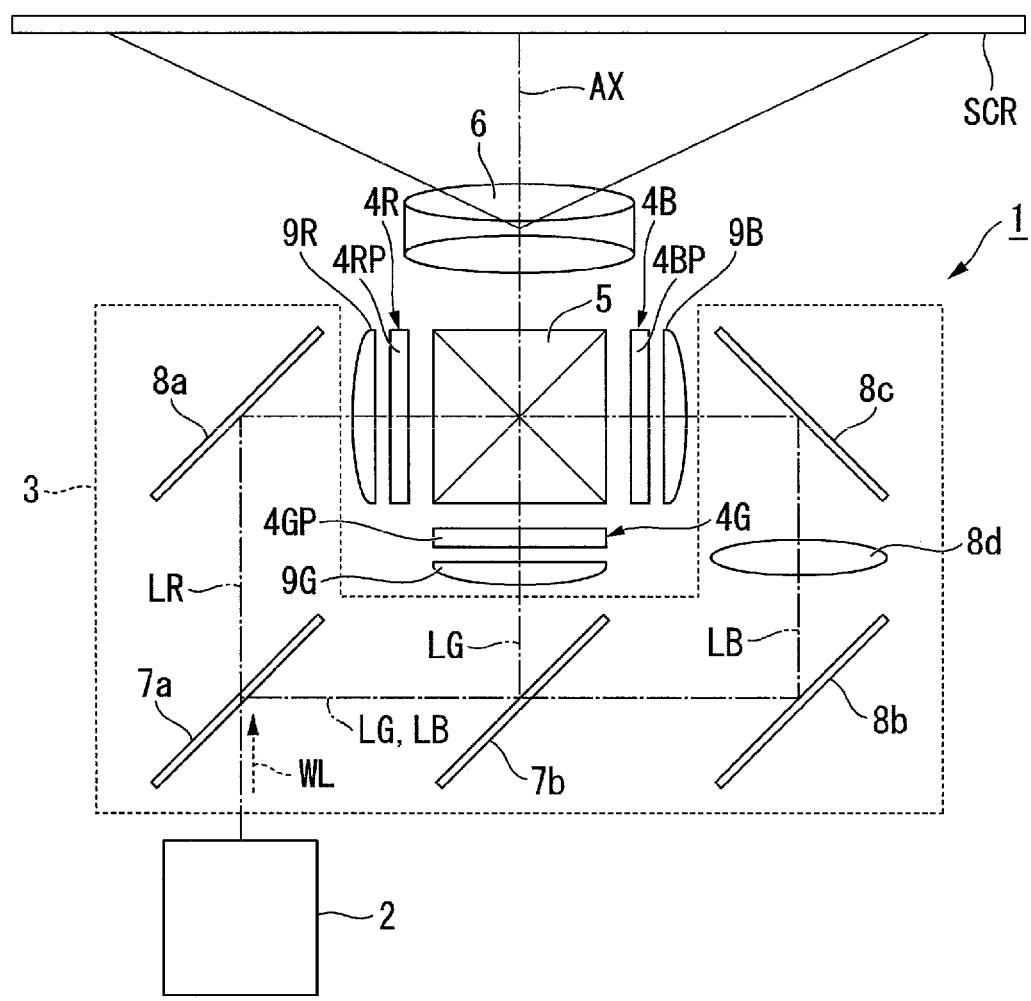
FIG. 1 is a schematic configuration diagram showing a projector according to an embodiment.
Figure 2:
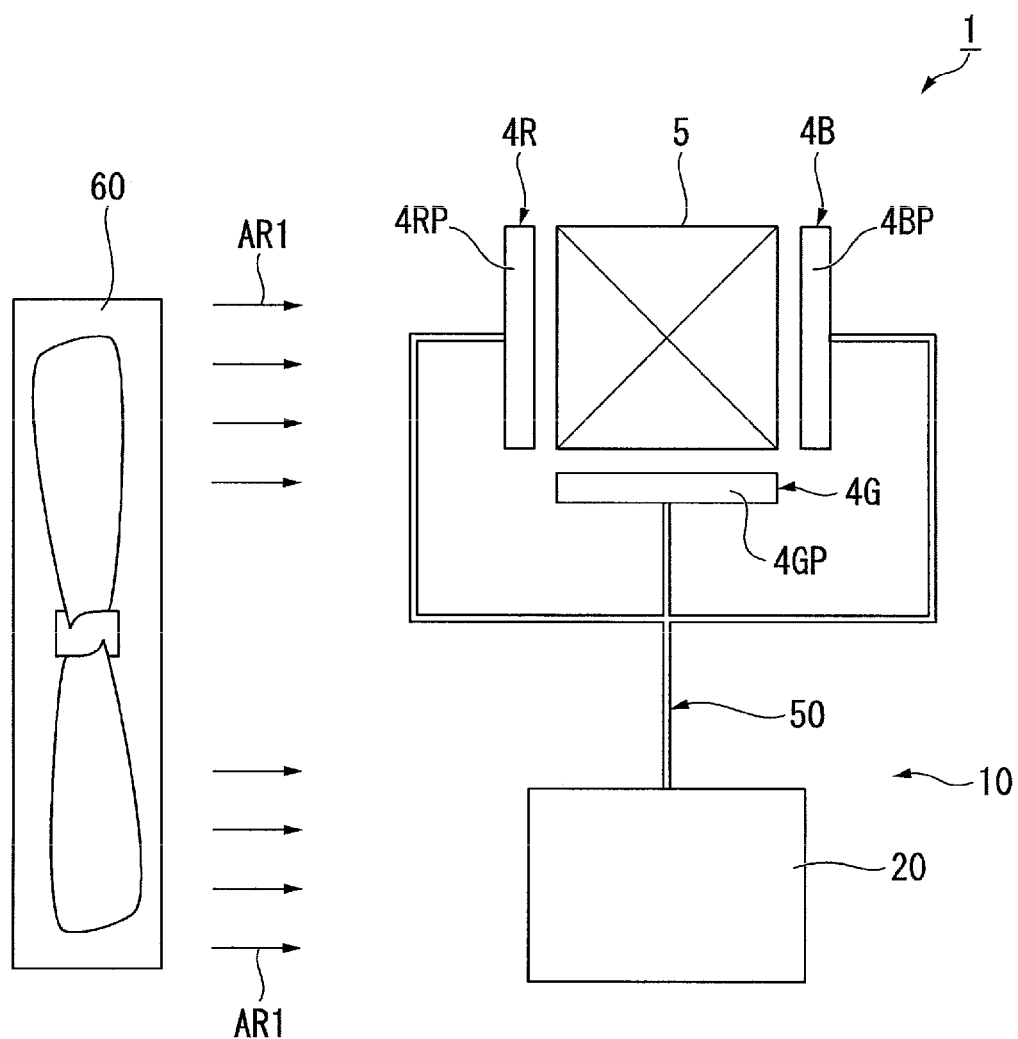
FIG. 2 is a schematic diagram showing a part of the projector according to the embodiment.

FIG. 1 is a schematic configuration diagram showing the projector 1 according to the present embodiment. FIG. 2 is a schematic diagram showing a part of the projector 1 according to the present embodiment. As shown in FIG. 1, the projector 1 is provided with a light source device 2, a color separation optical system 3, a light modulation unit 4R, alight modulation unit 4G, a light modulation unit 4B, a light combining optical system 5, and a projection optical device 6. The light modulation unit 4R has a light modulator 4RP. The light modulation unit 4G has a light modulator 4GP. The light modulation unit 4B has a light modulator 4BP.

The light source device 2 emits illumination light WL regulated so as to have a substantially homogenous illuminance distribution toward the color separation optical system 3. The light source device 2 has, for example, a semiconductor laser as a light source. The color separation optical system 3 separates the illumination light WL from the light source device 2 into red light LR, green light LG, and blue light LB. The color separation optical system 3 is provided with a first dichroic mirror 7a, a second dichroic mirror 7b, a first reflecting mirror 8a, a second reflecting mirror 8b, a third reflecting mirror 8c, and a relay lens 8d.

The first dichroic mirror 7a separates the illumination light WL having been emitted from the light source device 2 into the red light LR, and the light including the green light LG and the blue light LB mixed with each other. The first dichroic mirror 7a has a property of transmitting the red light LR, while reflecting the green light LG and the blue light LB. The second dichroic mirror 7b separates the light including the green light LG and the blue light LB mixed with each other into the green light LG and the blue light LB. The second dichroic mirror 7b has a property of reflecting the green light LG, while transmitting the blue light LB.

The first reflecting mirror 8a is disposed in the light path of the red light LR, and the red light LR having been transmitted through the first dichroic mirror 7a is reflected by the first reflecting mirror 8a toward the light modulator 4RP. The second reflecting mirror 8b and the third reflecting mirror 8c are disposed in the light path of the blue light LB, and the blue light LB having been transmitted through the second dichroic mirror 7b is guided by the second reflecting mirror 8b and the third reflecting mirror 8c to the light modulator 4BP.

The light modulator 4RP, the light modulator 4GP, and the light modulator 4BP are each formed of a liquid crystal panel. The light modulator 4RP modulates the red light LR out of the light emitted from the light source device 2 in accordance with an image signal. The light modulator 4GP modulates the green light LG out of the light emitted from the light source device 2 in accordance with an image signal. The light modulator 4BP modulates the red light LB out of the light emitted from the light source device 2 in accordance with an image signal. Thus, the light modulators 4RP, 4GP, and 4BP each form image light corresponding to the colored light. Although not shown in the drawings, on the light incident side and the light exit side of each of the light modulators 4RP, 4GP, and 4BP, there are respectively disposed polarization plates.

On the light incident side of the light modulator 4RP, there is disposed a field lens 9R for collimating the red light LR entering the light modulator 4RP. On the light incident side of the light modulator 4GP, there is disposed a field lens 9G for collimating the green light LG entering the light modulator 4GP. On the light incident side of the light modulator 4BP, there is disposed a field lens 9B for collimating the blue light LB entering the light modulator 4BP.

The color combining optical system 5 is formed of across dichroic prism having a substantially cubic shape. The light combining optical system 5 combines the image light of the colored light from the light modulators 4RP, 4GP, and 4BP with each other. The light combining optical system 5 emits the image light thus combined toward the projection optical device 6. The projection optical device 6 is formed of a projection lens group. The projection optical device 6 projects the image light combined by the light combining optical system 5, namely the light modulated by the light modulators 4RP, 4GP, and 4BP, toward a screen SCR in an enlarged manner. Thus, a color image (picture) thus enlarged is displayed on the screen SCR.

As shown in FIG. 2, the projector 1 is further provided with a cooler 10. The cooler 10 cools a cooling target provided to the projector 1 based on transformation of a refrigerant W into a gas. In the present embodiment, the refrigerant W is, for example, water as a fluid. Therefore, in the following description, the change of the refrigerant W to the gas is simply referred to as evaporation in some cases. In the present embodiment, the cooling target includes the light modulation units 4R, 4G, and 4B. In other words, in the present embodiment, the cooling target includes the light modulators 4RP, 4GP, and 4BP.

The cooler 10 has a refrigerant generator 20 and a refrigerant sender 50. The refrigerant generator 20 is a section for generating the refrigerant W. The refrigerant sender 50 is a section for transmitting the refrigerant W thus generated toward the cooling target. Due to the evaporation of the refrigerant W having been transmitted by the refrigerant sender 50 to the cooling target, namely the light modulation units 4R, 4G, and 4B in the present embodiment, it is possible for the cooler 10 to cool the cooling target. Each of the sections will hereinafter be described in detail.

Figure 3:
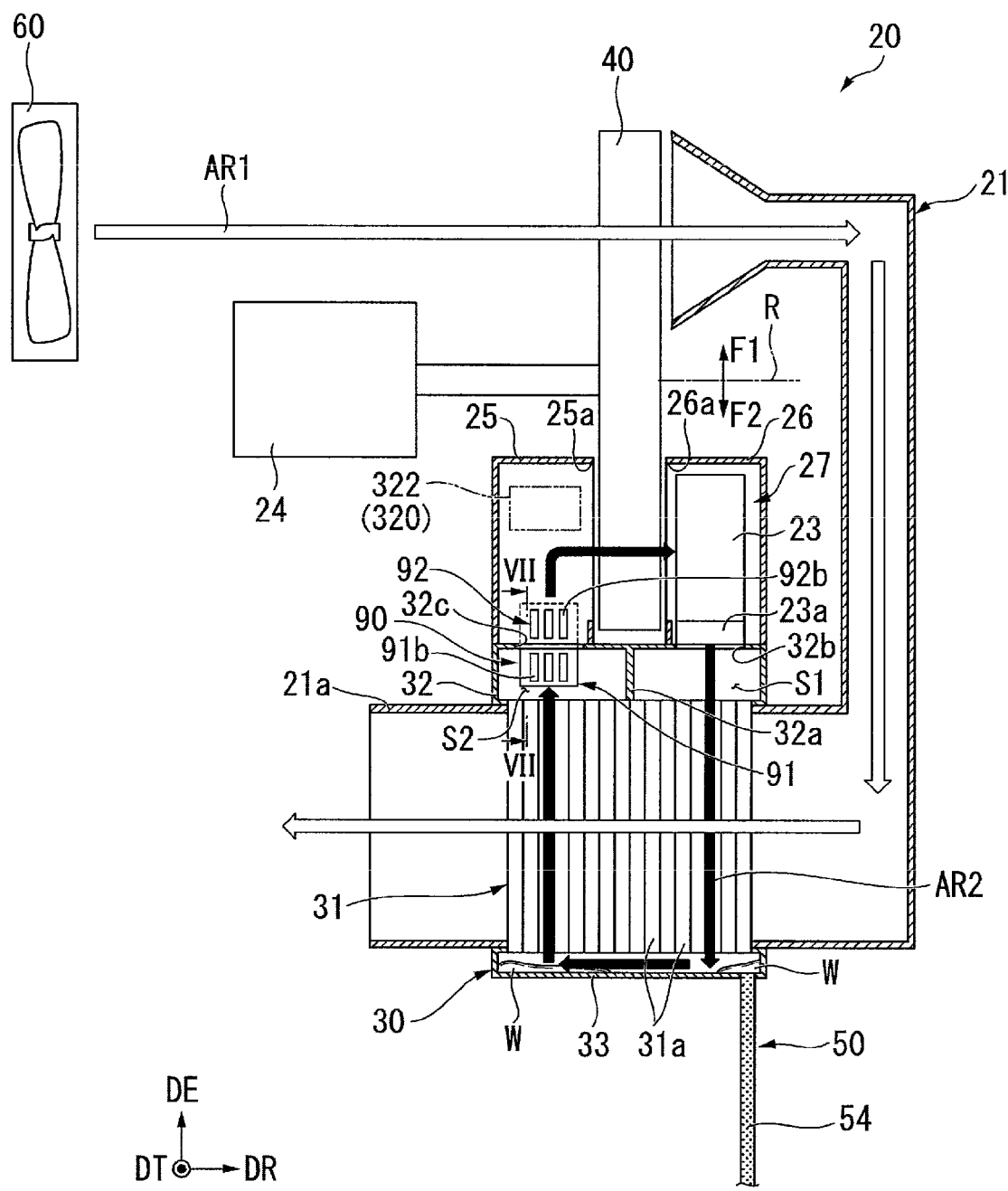
FIG. 3 is a schematic configuration diagram schematically showing a refrigerant generator in the embodiment.

FIG. 3 is a schematic configuration diagram schematically showing a refrigerant generator 20 in the present embodiment. As shown in FIG. 3, the refrigerant generator 20 has a moisture absorption/desorption member 40, a motor 24, a first blower 60, a first heat exchanger 30, a first circulation duct 25, a second circulation duct 26, a second blower 23, a cooling duct 21, and a second heat exchanger 90.

Figure 4:
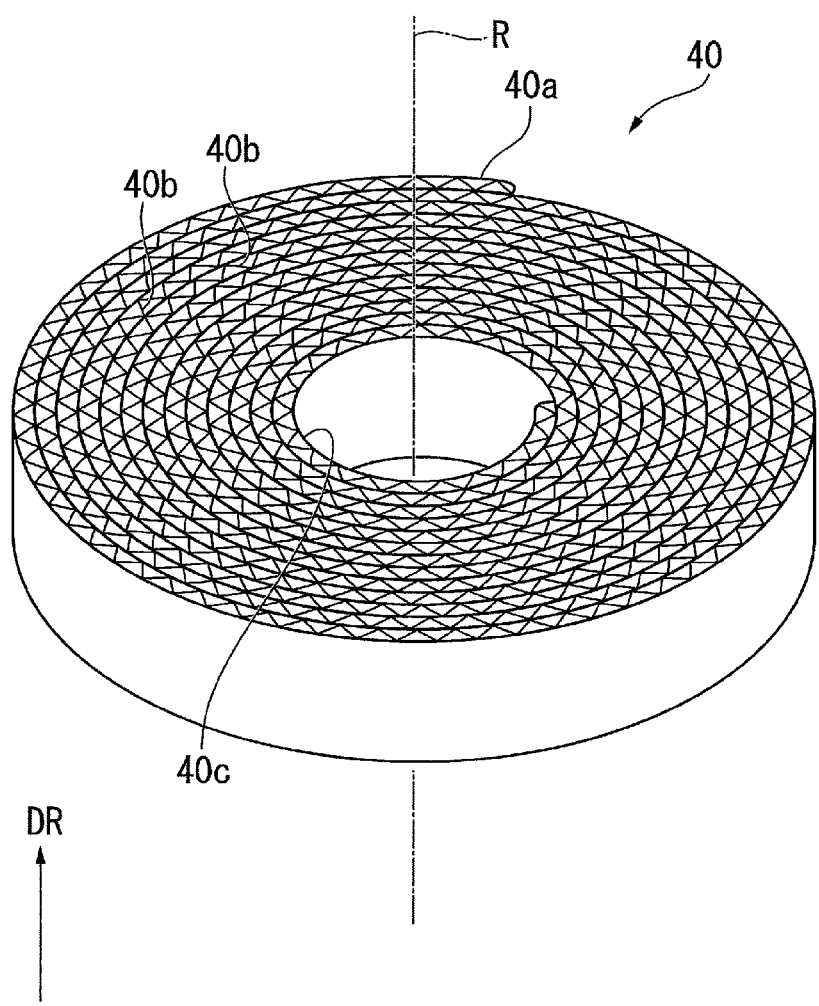
FIG. 4 is a perspective view showing a moisture absorption/desorption member in the embodiment.

FIG. 4 is a perspective view showing the moisture absorption/desorption member 40. As shown in FIG. 4, the moisture absorption/desorption member 40 has a flat cylindrical shape centered on a rotational axis R. In a central part of the moisture absorption/desorption member 40, there is formed a central hole 40c centered on the rotational axis R. The central hole 40c penetrates the moisture absorption/desorption member 40 in a axial direction of the rotational axis R. The moisture absorption/desorption member 40 rotates around the rotational axis R. In the following description, the axial direction of the rotational axis R is referred to as a "rotational axis direction DR," and is arbitrarily represented by a DR axis in the drawings.

The moisture absorption/desorption member 40 has an infinitely large number of through holes 40b penetrating the moisture absorption/desorption member 40b in the rotational axis direction DR. The moisture absorption/desorption member 40 is a porous member. The moisture absorption/desorption member 40 has a moisture absorption/desorption property. In the present embodiment, the moisture absorption/desorption member 40 is manufactured by, for example, winding a belt-like member 40a shaped like a belt and having the through holes 40b around the rotational axis R, and then coating a surface exposed outside in the belt-like member 40a thus wound with a material having a moisture absorption/desorption property. It should be noted that the surface exposed outside in the belt-like member 40a thus wound includes an outside surface of the moisture absorption/desorption member 40, an inner circumferential surface of the central hole 40c, and internal surfaces of the through holes 40b. It should be noted that the moisture absorption/desorption member 40 can be made of a material wholly provided with the moisture absorption/desorption property. As the material having the moisture absorption/desorption property, there can be cited, for example, zeolite and silica gel.

An output shaft of the motor 24 shown in FIG. 3 is fixed in a state of being inserted into the central hole 40c of the moisture absorption/desorption member 40. The motor 24 rotates the moisture absorption/desorption member 40 around the rotational axis R. The rotational speed of the moisture absorption/desorption member 40 is, for example, about no lower than 0.2 rpm and no higher than 5 rpm.

The first blower 60 is, for example, an intake fan for taking external air in the projector 1. The first blower 60 feeds air AR1 to apart of the moisture absorption/desorption member 40 located in a first area F1. The first area F1 is an area on one side of the rotational axis R in the direction perpendicular to the rotational axis R. In contrast, in the direction perpendicular to the rotational axis R, an area on the other side of the rotational axis R, namely an area on the opposite side to the first area F1 with respect to the rotational axis R, corresponds to a second area F2. The first area F1 is an area on the upper side of the rotational axis R in FIG. 3. The second area F2 is an area on the lower side of the rotational axis R in FIG. 3.

As shown in FIG. 2, the first blower 60 feeds the air AR1 also to the light modulation units 4R, 4G, and 4B as the cooling target. The first blower 60 is not particularly limited providing the first blower 60 can feed the air AR1, and can be, for example, an axial fan or a centrifugal fan.

Figure 5:
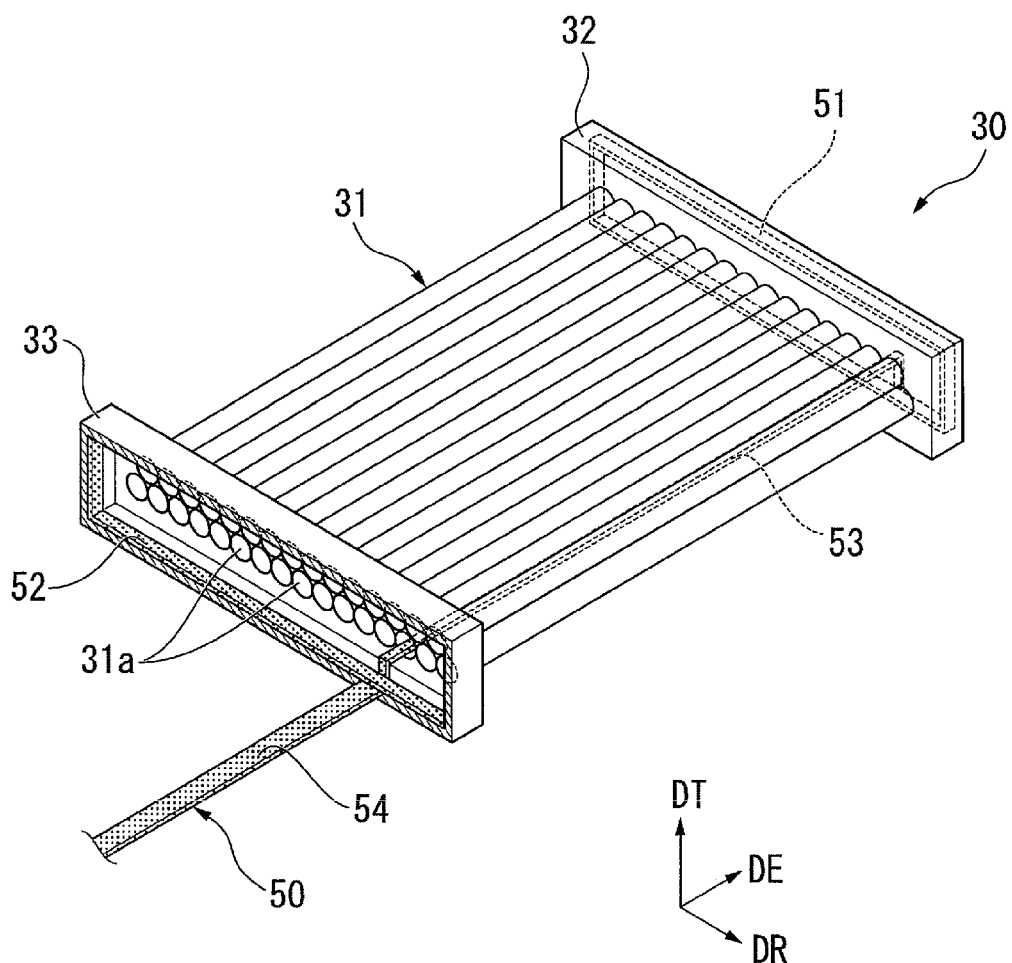
FIG. 5 is a partial cross-sectional perspective view showing a first heat exchanger in the embodiment.

The first heat exchanger 30 is a section where the refrigerant W is generated. FIG. 5 is a partial cross-sectional perspective view showing the first heat exchanger 30. As shown in FIG. 5, the first heat exchanger 30 has a circulation section 31, a first lid part 32 and a second lid part 33.

The circulation section 31 has a plurality of pipe parts 31a each having a tubular shape extending in one direction. In the present embodiment, the one direction in which the pipe parts 31a extend is, for example, perpendicular to the rotational axis direction DR. The pipe parts 31a each open on both sides in the one direction in which the pipe parts 31a extend. A cross-sectional shape perpendicular to the one direction in which the pipe part 31a extends is, for example, a circular shape. It should be noted that in the following description, the one direction in which the pipe parts 31a extend is referred to as an "extension direction DE," and is arbitrarily represented by a DE axis in the drawings. The first area F1 and the second area F2 described above are separated in the extension direction DE perpendicular to the rotational axis direction DR with reference to the rotational axis R.

In the present embodiment, the circulation section 31 is formed by stacking a plurality of layers each formed of the plurality of pipe parts 31a arranged along the rotational axis direction DR along a direction perpendicular to both of the rotational axis direction DR and the extension direction DE. It should be noted that in the following description, the direction perpendicular to both of the rotational axis direction DR and the extension direction DE is referred to as a "thickness direction DT," and is arbitrarily represented by a DT axis in the drawings. In the present embodiment, the dimension in the thickness direction of the circulation section 31 is, for example, smaller than the dimension in the rotational axis direction DR of the circulation section 31, and is the smallest of the dimensions of the circulation section 31 in the direction perpendicular to the extension direction DE.

The first lid part 32 is coupled to an end part on one side (+DE side) in the extension direction DE in the circulation section 31. The first lid part 32 has a rectangular solid box-like shape elongated in the rotational axis direction DR. Inside the first lid part 32, there open one ends in the extension direction DE of the pipe parts 31a. As shown in FIG. 3, inside the first lid part 32, there is disposed a partition part 32a. The partition part 32a separates the inside of the first lid part 32 into a first space S1 and a second space S2 arranged side by side in the rotational axis direction DR. In FIG. 3, the first space S1 is located on the right side (+DR side) of the second space S2.

The first lid part 32 is provided with a communication hole 32b for connecting the first space S1 and the inside of the second circulation duct 26 to each other. The first lid part 32 is provided with a communication hole 32c for connecting the second space S2 and the inside of the first circulation duct 25 to each other.

The second lid part 33 is coupled to an end part on the other side (−DE side) in the extension direction DE in the circulation section 31, namely an end part on an opposite side to the side where the first lid part 32 is coupled to the circulation section 31. As shown in FIG. 5, the second lid part 33 has a rectangular solid box-like shape elongated in the rotational axis direction DR. Inside the second lid part 33, there open the other ends in the extension direction DE of the pipe parts 31a. Unlike the first lid part 32, the inside the second lid part 33 is not partitioned. The inside of the second lid part 33 is connected to each of the first space S1 and the second space S2 of the first lid part 32 via the inside of the pipe parts 31a of the circulation section 31. The second lid part 33 is coupled to the refrigerant sender 50. Thus, the first heat exchanger 30 is coupled to the refrigerant sender 50. It should be noted that in FIG. 5, a wall on the other side in the extension direction DE in the second lid part 33 is omitted.

As shown in FIG. 3, the first circulation duct 25 is a duct extending from the first heat exchanger 30 to an area on the other side (−DR side) in the rotational axis direction DR of the moisture absorption/desorption member 40. One end part of the first circulation duct 25 is coupled to the first heat exchanger 30. The first circulation duct 25 has an inflow port to be connected to the communication hole 32c of the first lid part 32. The inside of the first circulation duct 25 is connected to the second space S2 via the inflow port and the communication hole 32c. The other end part of the first circulation duct 25 is disposed so as to be opposed to the moisture absorption/desorption member 40 with a narrow gap. Through the first circulation duct 25, there passes the air to be fed by the second blower 23 from the inside of the first heat exchanger 30 to the moisture absorption/desorption member 40.

The first circulation duct 25 has a first opening part 25a opposed to a part of the moisture absorption/desorption member 40 located in the second area F2. The first opening part 25a is located on the other side (−DR side) in the rotational axis direction DR of the moisture absorption/desorption member 40, and opens on one side (+DR side) in the rotational axis direction DR toward the moisture absorption/desorption member 40.

The second circulation duct 26 is a duct extending from an area on one side (+DR side) in the rotational axis direction DR of the moisture absorption/desorption member 40 to the first heat exchanger 30. One end part of the second circulation duct 26 is disposed so as to be opposed to the moisture absorption/desorption member 40 with a narrow gap. The other end part of the second circulation duct 26 is coupled to the first heat exchanger 30. The second circulation duct 26 has an outflow port to be connected to the communication hole 32b of the first lid part 32. The inside of the second circulation duct 26 is connected to the first space S1 via the outflow port and the communication hole 32b. Through the second circulation duct 26, there passes the air to be fed by the second blower 23 from the moisture absorption/desorption member 40 to the inside of the first heat exchanger 30.

The second circulation duct 26 has a second opening part 26a opposed to a part of the moisture absorption/desorption member 40 located in the second area F2. The second opening part 26a is located on the one side (+DR side) in the rotational axis direction DR of the moisture absorption/desorption member 40, and opens on the other side (−DR side) in the rotational axis direction DR toward the moisture absorption/desorption member 40. The second opening part 26a is located at a position where the moisture absorption/desorption member 40 is sandwiched between the second opening part 26a and the first opening part 25a in the rotational axis direction DR.

The second blower 23 is disposed inside the second circulation duct 26. The second blower 23 is disposed on the one side (+DR side) of the part of the moisture absorption/desorption member 40 located in the second area F2 in the rotational axis direction DR. The second blower 23 is, for example, a centrifugal fan. The air taken from the other side (−DR side) in the rotational axis direction DR is discharged by the second blower 23 toward the other side (−DE side) in the extension direction DE from an exhaust port 23a. The exhaust port 23a opens in the communication hole 32b of the first lid part 32. The second blower 23 feeds the air to the first space S1 via the communication hole 32b.

The air discharged from the second blower 23 to the first space S1 is the air having been taken in from the other side (−DR side) in the rotational axis direction DR of the second blower 23 via the second opening part 26a of the second circulation duct 26, and is the air having passed through the part of the moisture absorption/desorption member 40 located in the second area F2. In other words, the second blower 23 makes the air pass through the part of the moisture absorption/desorption member 40 located in the second area F2 different from the first area F1, and then feeds the air to the first heat exchanger 30.

The air which has flowed into the first heat exchanger 30 from the second blower 23 via the first space S1 passes inside the pipe parts 31a connected to the first space S1 out of the plurality of pipe parts 31a, and then inflows into the inside of the second lid part 33. The air which has flowed into the inside of the second lid part 33 passes through the inside of the pipe parts 31a connected to the second space S2 out of the plurality of pipe parts 31a, then inflows into the second space S2, and then inflows into the inside of the first circulation duct 25 from the communication hole 32c. The air having flowed into the inside of the first circulation duct 25 is discharged from the first opening part 25a toward the moisture absorption/desorption member 40, then passes through the part of the moisture absorption/desorption member 40 located in the second area F2 once again, then inflows into the inside of the second circulation duct 26, and is then taken by the second blower 23.

As described above, the refrigerant generator 20 has a circulation channel 27 that passes through the part of the moisture absorption/desorption member 40 located in the second area F2 and the first heat exchanger 30. The circulation channel 27 is a channel through which the air circulates so as to pass through the first circulation duct 25, the part of the moisture absorption/desorption member 40 located in the second area F2, and the second circulation duct 26 in this order from the first heat exchanger 30, and then return to the first heat exchanger 30 once again. The second blower 23 circulates the air in the circulation channel 27. Although a narrow gap is provided between the moisture absorption/desorption member 40 and each of the first circulation duct 25 and the second circulation duct 26, the circulation channel 27 is substantially sealed, and thus, the air from the outside is prevented from inflowing into the inside of the circulation channel 27. It should be noted that in the following description, the air circulating through the circulation channel 27 is referred to as air AR2.

The cooling duct 21 is a duct having an inflow port disposed on the one side (+DR side) of the part of the moisture absorption/desorption member 40 located in the first area F1 in the rotational axis direction DR. Into the cooling duct 21, there inflows the air AR1 which has been discharged from the first blower 60, and has passed through the part of the moisture absorption/desorption member 40 located in the first area F1. The cooling duct 21 extends from an area on one side of the part of the moisture absorption/desorption member 40 located in the first area F1 toward the first heat exchanger 30.

The cooling duct 21 has a cooling passage part 21a extending in the rotational axis direction DR. In the cooling passage part 21a, there is disposed the circulation section 31 of the first heat exchanger 30 so as to penetrate in the extension direction DE. Thus, in the inside of the cooling passage part 21a, there is disposed the circulation section 31. The air AR1 passing through the cooling passage part 21a is made to blow against the outside surface of the circulation section 31, and then passes through the circulation section 31 in the rotational axis direction DR. Thus, the circulation section 31 is cooled by the air AR1. In other words, the first heat exchanger 30 is cooled by the air AR1 which has been discharged from the first blower 60, and then passed through the moisture absorption/desorption member 40. In FIG. 3, the air AR1 passes through the circulation section 31 from the right side to the left side in the cooling passage part 21a. An end part on the other side (−DR side) in the rotational axis direction DR in the cooling passage part 21a opens. The opening of the cooling passage part 21a is, for example, an outflow port of the cooling duct 21.

Figure 6:
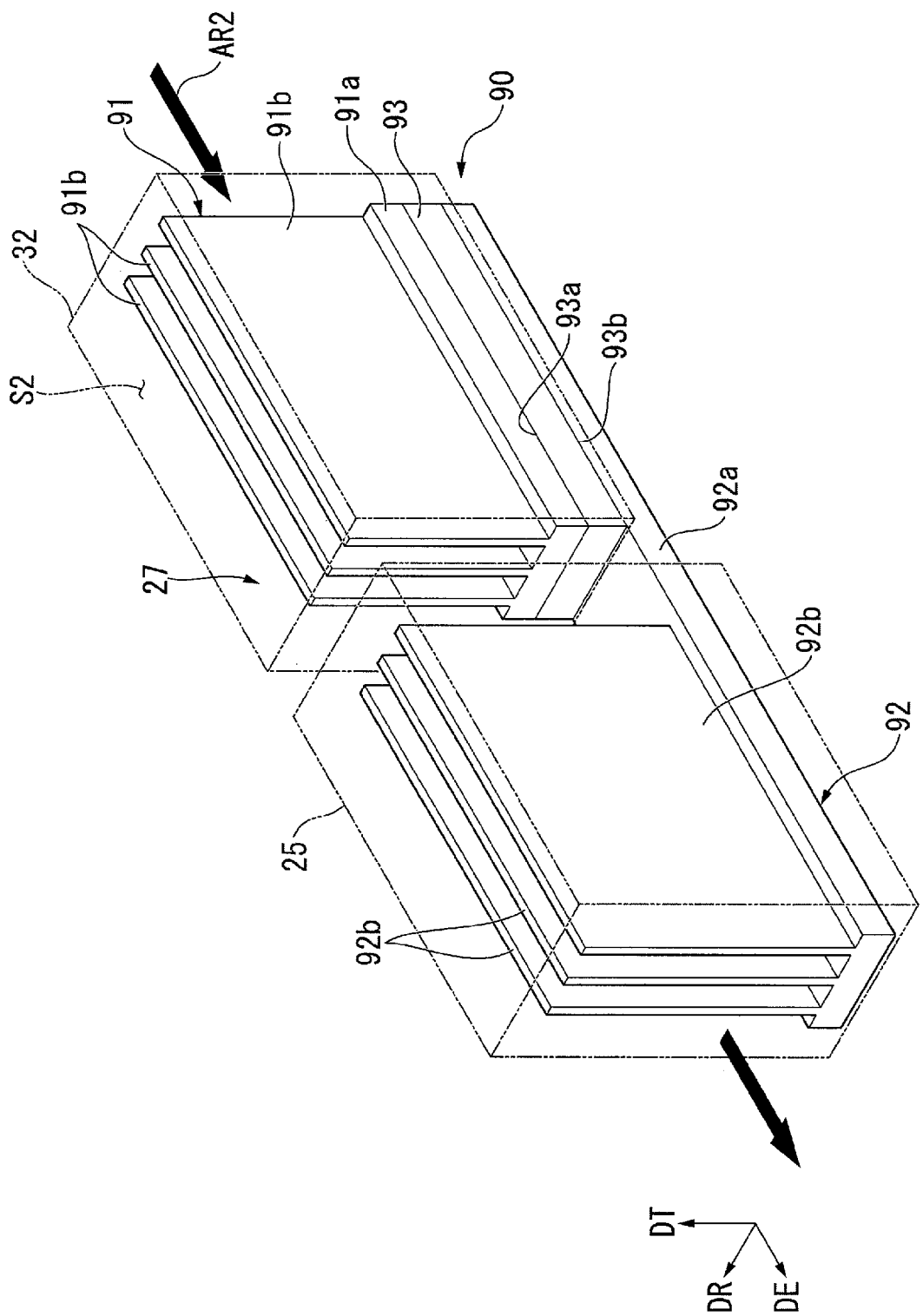
FIG. 6 is a perspective view showing a second heat exchanger in the embodiment.
Figure 7:
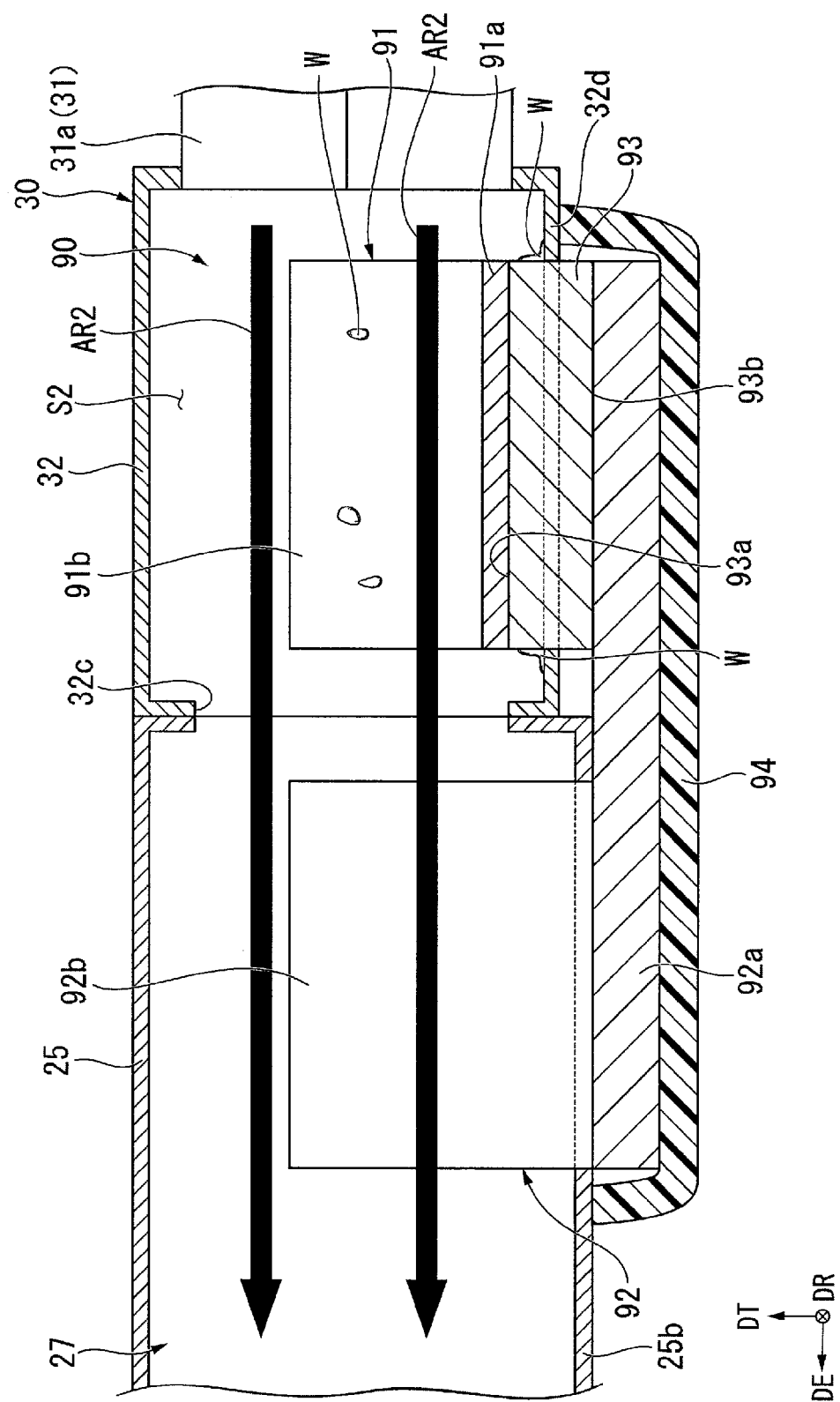
FIG. 7 is a cross-sectional view showing the second heat exchanger in the embodiment, and corresponds to a VII-VII cross-sectional view in FIG. 3.

FIG. 6 is a perspective view showing the second heat exchanger 90. FIG. 7 is a cross-sectional view showing the second heat exchanger 90, and corresponds to a VII-VII cross-sectional view in FIG. 3.

As shown in FIG. 6 and FIG. 7, at least a part of the second heat exchanger 90 is disposed in a part where the air AR2 which flows from the first heat exchanger 30 to the moisture absorption/desorption member 40 inside the circulation channel 27 passes. In the present embodiment, the second heat exchanger 90 cools the air AR2 discharged from the circulation section 31 of the first heat exchanger 30 to generate the refrigerant W, and at the same time, heats the air AR2 thus cooled. In the present embodiment, the flow direction of the air AR2 passing through the second heat exchanger 90 is the extension direction DE. In the following description, one side (+DE side) in the extension direction DE is downstream in the direction in which the air AR2 passing through the second heat exchanger 90 flows, and the other side (−DE side) in the extension direction DE is upstream in the direction in which the air AR2 passing through the second heat exchanger 90 flows. The second heat exchanger 90 has a thermoelectric element 93, a first heat-transfer member 91, a second heat-transfer member 92, and a heat insulation member 94.

The thermoelectric element 93 is a plate-like element extending along the extension direction DE as the flow direction of the air AR2 passing through the second heat exchanger 90 inside the circulation channel 27. A plate surface of the thermoelectric element 93 is, for example, perpendicular to a thickness direction DT. The thermoelectric element 93 is a Peltier element. The thermoelectric element 93 has a heat absorption surface 93a and a heat dissipation surface 93b. In the present embodiment, the heat absorption surface 93a is a plate surface on one side (+DT side) in the thickness direction DT in the thermoelectric element 93. The heat dissipation surface 93b is a plate surface on the other side (−DT side) in the thickness direction DT in the thermoelectric element 93. In other words, the heat absorption surface 93a and the heat dissipation surface 93b are surfaces of the thermoelectric element 93 located on the sides opposite to each other in the thickness direction DT. By supplying the power to the thermoelectric element 93, the thermoelectric element 93 absorbs the heat from the heat absorption surface 93a, and then releases the heat from the heat dissipation surface 93b.

As shown in FIG. 7, the thermoelectric element 93 is provided to the first lid part 32. The thermoelectric element 93 is disposed so as to penetrate a wall part 32d on the other side (−DT side) in the thickness direction DT of the first lid part 32 in the thickness direction DT. The thermoelectric element 93 is disposed so as to straddle the inside of the first lid part 32 and the outside of the first lid part 32. The heat absorption surface 93a is disposed inside the second space S2. In contrast, the heat dissipation surface 93b is disposed outside the first lid part 32.

The first heat-transfer member 91 is a member thermally coupled to the heat absorption surface 93a. It should be noted that the expression that the first heat-transfer member 91 is thermally coupled to the heat absorption surface 93a is sufficiently fulfilled by the fact that the first heat-transfer member 91 and the heat absorption surface 93a are coupled to each other in a state in which the transfer of the heat between the heat absorption surface 93a and the first heat-transfer member 91 is achievable. Since the heat absorption surface 93a is a surface for absorbing heat, transfer of heat from the first heat-transfer member 91 to the heat absorption surface 93a is made possible. In the present embodiment, the first heat-transfer member 91 is a heatsink. The first heat-transfer member 91 has a base part 91a and a plurality of fins (a heat absorption section) 91b.

As shown in FIG. 6 and FIG. 7, the base part 91a is shaped like a plate extending in the extension direction DE. A plate surface of the base part 91a is, for example, perpendicular to the thickness direction DT. A surface on the other side (−DT side) in the thickness direction in the base part 91a has contact with the heat absorption surface 93a, and is fixed. Thus, the first heat-transfer member 91 is thermally coupled to the heat absorption surface 93a. In the present embodiment, the base part 91a is disposed inside the second space S2 in the first lid part 32, namely inside the first heat exchanger 30. When viewed along the thickness direction DT, the whole of the base part 91a overlaps, for example, the whole of the heat absorption surface 93a.

The plurality of fins 91b is disposed on a surface on one side (+DT side) in the thickness direction DT in the base part 91a. The plurality of fins 91b projects toward the one side in the thickness direction DT from the base part 91a. In the present embodiment, the fins 91b are each shaped like a plate extending along the direction (the extension direction DE) in which the air AR2 passing through the second heat exchanger 90 flows inside the circulation channel 27. A plate surface of each of the fins 91b is, for example, perpendicular to the rotational axis direction DR. The fins 91b are each shaped like, for example, a rectangular plate.

The plurality of fins 91b is disposed at intervals along the rotational axis direction DR. In the present embodiment, the plurality of fins 91b is disposed inside the second space S2 in the first lid part 32, namely inside the first heat exchanger 30. As described above, in the present embodiment, the first heat-transfer member 91 is entirely disposed inside the second space S2, namely inside the first heat exchanger 30.

The second heat-transfer member 92 is a member thermally coupled to the heat dissipation surface 93b. It should be noted that the expression that the second heat-transfer member 92 is thermally coupled to the heat dissipation surface 93b is sufficiently fulfilled by the fact that the second heat-transfer member 92 and the heat dissipation surface 93b are coupled to each other in a state in which the transfer of the heat between the heat dissipation surface 93b and the second heat-transfer member 92 is achievable. Since the heat dissipation surface 93b is a surface for releasing heat, transfer of heat from the heat dissipation surface 93b to the second heat-transfer member 92 is made possible. In the present embodiment, the second heat-transfer member 92 is a heatsink. The second heat-transfer member 92 has a base part 92a and a plurality of fins (a heat dissipation section) 92b.

The base part 92a is shaped like a plate extending in the extension direction DE. A plate surface of the base part 92a is, for example, perpendicular to the thickness direction DT. As shown in FIG. 7, the base part 92a is disposed outside the circulation channel 27. The base part 92a extends in the extension direction DE from an area on the other side (−DT side) in the thickness direction DT of the first lid part 32 to an area on the other side in the thickness direction DT of the first circulation duct 25. Apart located on the other side (−DE side) in the extension direction DE in the surface on the other side (−DT side) in the thickness direction in the base part 92a has contact with the heat dissipation surface 93b, and is fixed. Thus, the second heat-transfer member 92 is thermally coupled to the heat dissipation surface 93b.

The plurality of fins 92b is disposed on a part located on one side (+DE side) in the extension direction DE of the surface on the one side (+DT side) in the thickness direction DT in the base part 92a. The plurality of fins 92b projects toward the one side in the thickness direction DT from the base part 92a. The plurality of fins 92b penetrates an wall part 25b on the other side (−DT side) in the thickness direction DT in the first circulation duct 25 in the thickness direction DT, and projects inside the first circulation duct 25. In other words, the plurality of fins 92b is disposed inside the first circulation duct 25. Thus, the plurality of fins 92b is disposed in a part where the air AR2 flowing from the first heat exchanger 30 to the moisture absorption/desorption member 40 in the circulation channel 27. The plurality of fins 92b is disposed on the downstream (+DE side) in the direction in which the air AR2 passing through the second heat exchanger 90 flows with respect to the fins 91b of the first heat-transfer member 91.

Tip parts on the projection side (+DT side) of the plurality of fins 92b are disposed at the same positions in the thickness direction DT as, for example, tip parts on the projection side of the plurality of fins 91b in the first heat-transfer member 91. As shown in FIG. 6, in the present embodiment, the fins 92b are each shaped like a plate extending along the direction (the extension direction DE) in which the air AR2 passing through the second heat exchanger 90 flows. A plate surface of each of the fins 92b is, for example, perpendicular to the rotational axis direction DR. The fins 92b are each shaped like, for example, a rectangular plate. The plurality of fins 92b is disposed at intervals along the rotational axis direction DR.

As shown in FIG. 7, the heat insulation member 94 covers the base part 92a of the second heat-transfer member 92 from the other side (−DT side) in the thickness direction DT. The heat radiation member 94 is, for example, a heat insulation sheet. The insulation member 94 has contact with a surface on the other side in the thickness direction DT in the base part 92a. An outer edge part of the heat insulation member 94 is fixed so as to straddle the outside surface of the first lid part 32 and the outside surface of the first circulation duct 25. The heat insulation member 94 prevents the heat which has been released from the heat dissipation surface 93b of the thermoelectric element 93 to the base part 92a from being released to the air located outside the circulation channel 27. It should be noted that the illustration of the heat insulation member 94 is omitted in FIG. 6.

When the power is supplied to the thermoelectric element 93, the heat of the first heat-transfer member 91 is absorbed by the heat absorption surface 93a, and thus, the first heat-transfer member 91 is cooled. Thus, the first heat-transfer member 91 absorbs the heat of the air AR2 inside the circulation channel 27 from the plurality of fins 91b to cool the air AR2. In other words, the plurality of fins 91b functions as the heat absorption section for cooling the air AR2 flowing through the circulation channel 27.

The heat absorbed by the heat absorption surface 93a is transferred to the heat dissipation surface 93b, and is released to the base part 92a of the second heat-transfer member 92. Further, to the base part 92a, there is also released the heat due to the power supplied to the thermoelectric element 93 from the heat dissipation surface 93b. The heat released to the base part 92a is transferred to the plurality of fins 92b after propagating the base part 92a, and is released from the plurality of fins 92b to the air AR2 flowing through the first circulation duct 25. In other words, the plurality of fins 92b functions as a heat dissipation section for heating the air AR2 flowing through the circulation channel 27. Here, in the present embodiment, the fins 92b as the heat dissipation section are disposed on the downstream (+DE side) in the flow direction of the air AR2 passing through the second heat exchanger 90 with respect to the first heat-transfer member 91. Therefore, the fins 92b as the heat dissipation section heat the air AR2 which has been cooled by the first heat-transfer member 91.

The air AR2 heated by the second heat-transfer member 92 is discharged from the first opening part 25a of the first circulation duct 25 to a part of the moisture absorption/desorption member 40 located in the second area F2. Thus, the part of the moisture absorption/desorption member 40 located in the second area F2 is heated. The second blower 23 circulates the air AR2 inside the circulation channel 27 to thereby feed the air on the periphery of the part thus heated in the moisture absorption/desorption member 40 to the first heat exchanger 30.

When the air AR1 is fed to the part of the moisture absorption/desorption member 40 located in the first area F1 from the first blower 60, the steam included in the air AR1 is absorbed by the part of the moisture absorption/desorption member 40 located in the first area F1. The part of the moisture absorption/desorption member 40 having absorbed the moisture moves from the first area F1 to the second area F2 by the motor 24 rotating the moisture absorption/desorption member 40. Then, through the moisture absorption/desorption member 40 located in the second area F2, there passes the air AR2 which has been heated by the second heat-transfer member 92 of the second heat exchanger 90 and has a relatively high temperature. Thus, the moisture having been absorbed by the moisture absorption/desorption member 40 evaporates to be released to the air AR2.

The air AR2 including the steam which has been absorbed from the air AR1 by passing through the moisture absorption/desorption member 40 is fed by the second blower 23 to the first heat exchanger 30. The air AR2 having flowed into the first heat exchanger 30 from the first space S1 flows through the circulation section 31. In more detail, the air AR2 flows through the pipe parts 31a of the circulation section 31. The circulation section 31 is cooled from the outside by the air AR1 flowing along the rotational axis direction DR through the cooling passage part 21a of the cooling duct 21.

When the circulation section 31 is cooled, the air AR2 which flows through the pipe parts 31a and is relatively high in temperature is cooled, and thus, the steam having been included in the air AR2 is condensed to the water as a fluid, namely the refrigerant W. In such a manner, the first heat exchanger 30 is cooled to thereby generate the refrigerant W from the air AR2 having flowed into the first heat exchanger 30.

The air AR2 having passed through the circulation section 31 is cooled inside the second space S2 of the first lid part 32 by the first heat-transfer member 91 of the second heat exchanger 90. Thus, at least apart of the steam remaining in the air AR2 having passed through the circulation section 31 is condensed to the refrigerant W. In such a manner, the first heat-transfer member 91 cools the air AR2 flowing through the circulation channel 27 to generate the refrigerant W. In the present embodiment, the first heat-transfer member 91 is disposed inside the second space S2 of the first lid part 32, and therefore, generates the refrigerant W inside the first heat exchanger 30.

In the present embodiment, the refrigerant sender 50 is formed of a porous member, and transmits the refrigerant due to a capillary action. As the material of the refrigerant sender 50, there can be cited, for example, polypropylene, cotton, and porous metal. It is preferable for the material of the refrigerant sender 50 to be a material capable of making the surface tension of the refrigerant sender 50 relatively high. As shown in FIG. 5, the refrigerant sender 50 has a first trapping part 51, a second trapping part 52, a third trapping part 53, and a coupling part 54.

The first trapping part 51 is fixed to an edge part on one side (+DE side) in the extension direction DE in the inside surface of the first lid part 32. The first trapping part 51 is shaped like a thin belt, and is formed along the edge part of the first lid part 32 to have a rectangular frame shape. The second trapping part 52 is fixed to an edge part on the other side (-DE side) in the extension direction DE in the inside surface of the second lid part 33. The second trapping part 52 is shaped like a thin belt, and is formed along the edge part of the second lid part 33 to have a rectangular frame shape.

The third trapping part 53 extends from the first trapping part 51 to the second trapping part 52 through the inside of the pipe parts 31a to couple the first trapping part 51 and the second trapping part 52 to each other. The third trapping part 53 is shaped like a thin belt extending in the extension direction DE. In the present embodiment, the third trapping part 53 is disposed inside one of the plurality of pipe parts 31a as shown in FIG. 6, but this is not a limitation. The third trapping part 53 can be disposed inside some of the plurality of pipe parts 31a, or can also be disposed inside all of the plurality of pipe parts 31a. When the third trapping part 53 is disposed inside some of the plurality of pipe parts 31a, it is also possible for the third trapping part 53 to be disposed inside two or more of the pipe parts 31a.

Figure 8:
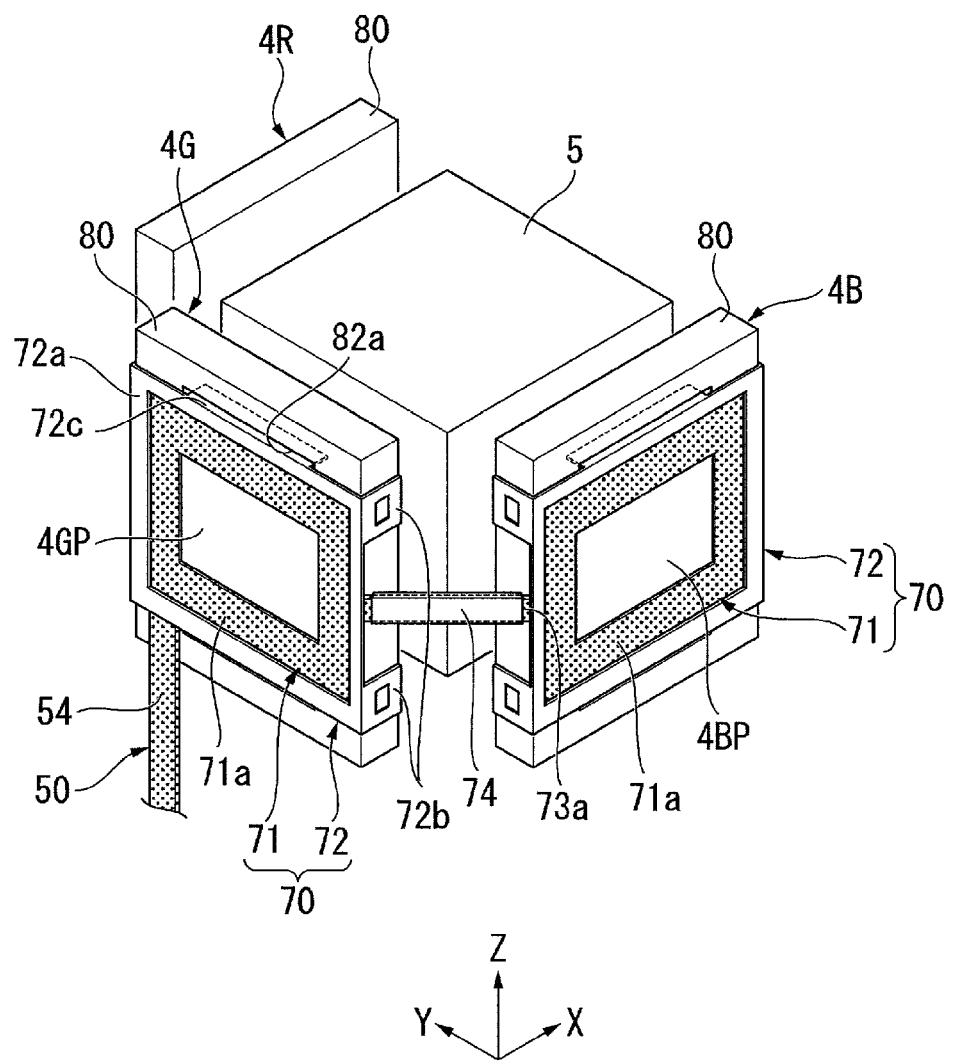
FIG. 8 is a perspective view showing a light modulation unit and a light combining optical system in the embodiment.

The coupling part 54 is a part for coupling the refrigerant generator 20 and the cooling target to each other. In the present embodiment, the coupling section 54 is coupled to the second trapping part 52, and projects from the inside of the second lid part 33 to the outside of the second lid part 33 so as to penetrate the wall of the second lid part 33. As shown in FIG. 8, the coupling part 54 projecting to the outside of the second lid part 33 extends to the light modulation unit 4G as the cooling target. FIG. 8 is a perspective view showing the light modulation units 4R, 4G, and 4B, and the light combining optical system 5. The coupling part 54 is shaped like a thin belt. As shown in FIG. 5, the width of the coupling part 54 is larger than, for example, the width of the first trapping part 51, the width of the second trapping part 52, and the width of the third trapping part 53.

Then, the light modulation units 4R, 4G, and 4B as the cooling target in the present embodiment will be described in more detail. In the following description, a vertical direction Z defining a positive side as an upper side and a negative side as a lower side is arbitrarily represented by a Z axis in the drawings. A direction parallel to an optical axis AX of a projection lens the closest to the light exit side in the projection optical device 6, namely a direction parallel to the projection direction of the projection optical device 6, is referred to as an "optical axis direction X," and is arbitrarily represented by an X axis in the drawings. The X-axis direction is perpendicular to the vertical direction Z. Further, a direction perpendicular to both of the optical axis direction X and the vertical direction Z is referred to as a "width direction Y," and is arbitrarily represented by a Y axis in the drawings.

It should be noted that the vertical direction Z, the upper side, and the lower side are mere names for explaining the relative positional relationship between the constituents, and the actual arrangement relationship and so on can also be other arrangement relationship and so on than the arrangement relationship and so on represented by these names.

Figure 9:
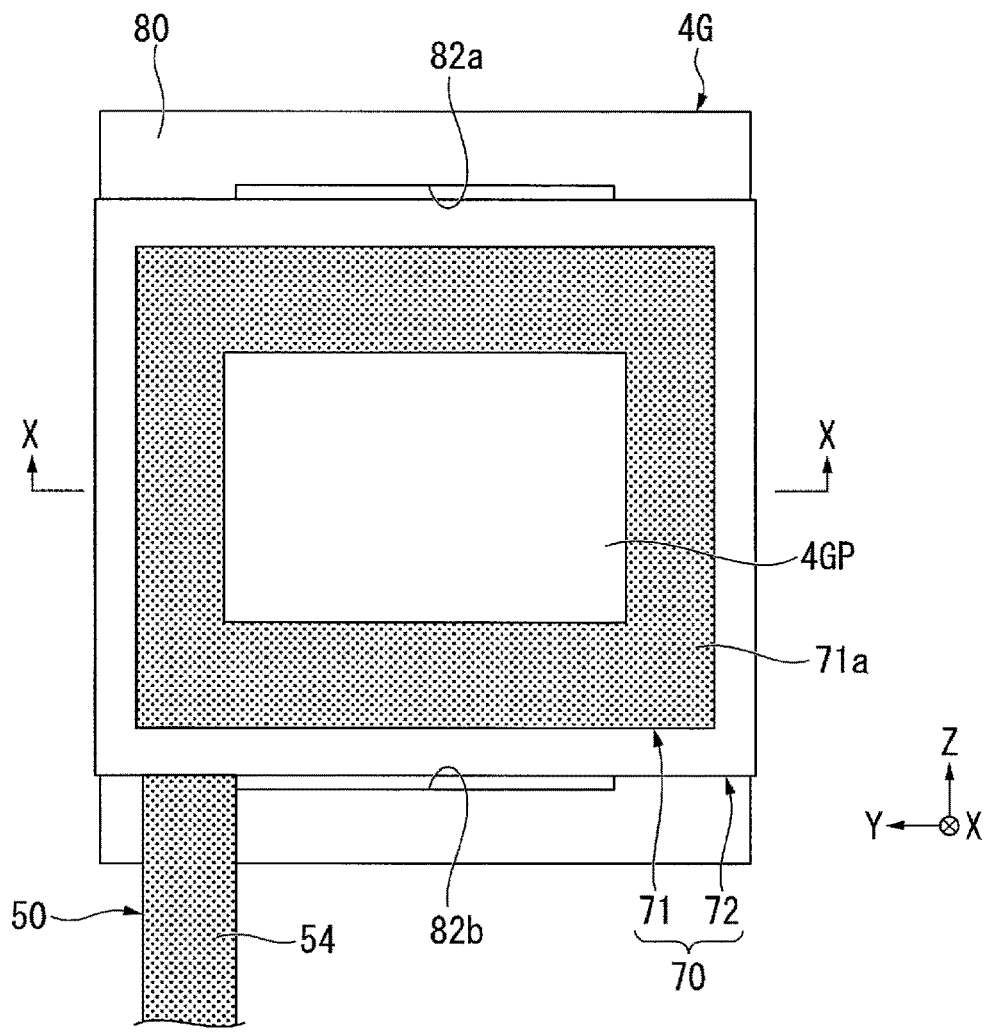
FIG. 9 is a diagram of the light modulation unit in the embodiment viewed from a light incident side.
Figure 10:
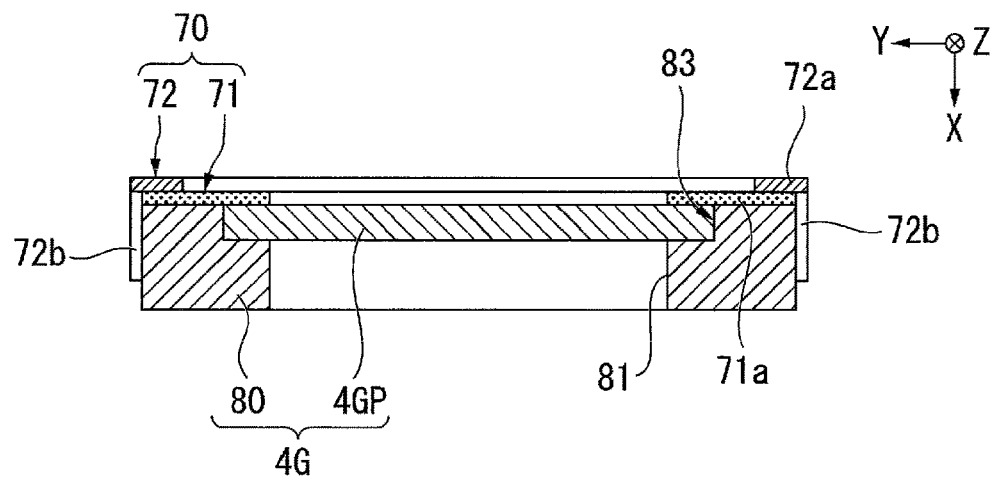
FIG. 10 is a diagram showing the light modulation unit in the embodiment, and corresponds to an X-X cross-sectional view in FIG. 9.

FIG. 9 is a diagram of the light modulation unit 4G viewed from a light incident side. FIG. 10 is a diagram showing the light modulation unit 4G, and corresponds to an X-X cross-sectional view in FIG. 9.

As shown in FIG. 8, the light modulation unit 4R, the light modulation unit 4G, and the light modulation unit 4B as the cooling target are disposed so as to surround the light combining optical system 5. The light modulation unit 4R and the light modulation unit 4B are disposed across the light combining optical system 5 from each other in the width direction Y. The light modulation unit 4G is disposed on the light incident side (-X side) in the optical axis direction X of the light combining optical system 5. Since the structure of the light modulation unit 4R, and structure of the light modulation unit 4G, and the structure of the light modulation unit 4B are substantially the same except the point that the arrangement position and the arrangement posture are different, in the following description, the light modulation unit 4G is described alone as a representative in some cases.

The light modulation unit 4G has a holding frame 80 for holding the light modulator 4GP. As shown in FIG. 8 through FIG. 10, the holding frame 80 is shaped like a substantially rectangular solid flat in a direction in which the light enters the light modulator 4GP and elongated in the vertical direction Z. The direction in which the light enters the light modulator 4GP is, for example, the optical axis direction X.

As shown in FIG. 10, the holding frame 80 has a through hole 81 penetrating the holding frame 80 in the incident direction of the light. On the edge on the light incident side (-X side) of the through hole 81, there is disposed a step part of increasing the width of the through hole 81. The light modulator 4GP is fitted in the step part 83 and held by the holding frame 80. As shown in FIG. 9, in the parts on the both sides in the vertical direction Z on the light incident side of the holding frame 80, there are formed insertion grooves 82a, 82b.

As shown in FIG. 8 through FIG. 10, the projector 1 is further provided with a cooling promotion section 70 installed in the light modulation unit 4G as the cooling target. The cooling promotion section 70 has a refrigerant retention section 71 and a fixation member 72. The refrigerant retention section 71 is attached to a surface of the holding frame 80 of the light modulation unit 4G as the cooling target. In the present embodiment, the refrigerant retention section 71 is disposed on a surface on the light incident side (-X side) of the light modulator 4GP in the holding frame 80. The refrigerant retention section 71 is formed of a porous member for retaining the refrigerant W. As the material of the refrigerant retention section 71, there can be cited, for example, polypropylene, cotton, and porous metal. The material of the refrigerant retention section 71 can be made the same as the material of, for example, the refrigerant sender 50. It is preferable for the material of the refrigerant retention section 71 to be a material capable of making the surface tension of the refrigerant retention section 71 relatively high.

Figure 11:
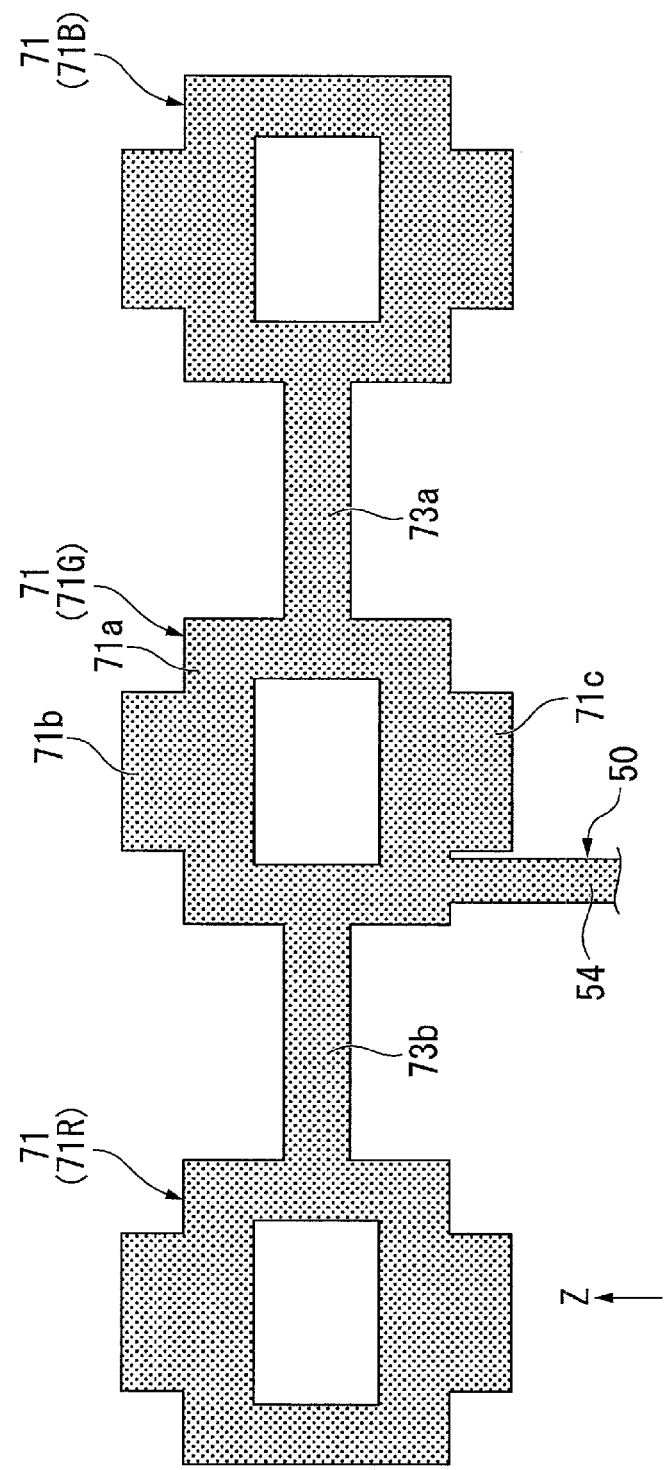
FIG. 11 is a diagram showing a refrigerant retention section in the embodiment.

FIG. 11 is a diagram showing the refrigerant retention section 71. As shown in FIG. 11, the refrigerant retention section 71 has a main body part 71a shaped like a rectangular frame, and insertion parts 71b, 71c disposed in end parts on both sides in the vertical direction Z in the main body part 71a. As shown in FIG. 10, the main body part 71a covers a part of the surface on the light incident side (-X side) of the light modulator 4GP in the holding frame 80. A portion on an inner edge side in the main body part 71a covers an outer edge portion of the light modulator 4GP. The insertion part 71b is folded, and is inserted in the insertion groove 82a of the holding frame 80. The insertion part 71c is folded, and is inserted in the insertion groove 82b of the holding frame 80.

The fixation member 72 is a member for fixing the refrigerant retention section 71. As shown in FIG. 8 and FIG. 10, the fixation member 72 is a plate like member. The fixation member 72 is made of, for example, metal. The fixation member 72 has a frame part 72a shaped like a rectangular frame, attachment parts 72b, and insertion parts 72c. As shown in FIG. 9 and FIG. 10, the frame part 72a covers an outer edge part of the refrigerant retention section 71. The holding frame 80, the refrigerant retention section 71, and the frame part 72a are stacked on one another in a direction (the optical axis direction X) of the light passing through the light modulation unit 4G. In the following description, the direction in which the holding frame 80, the refrigerant retention section 71, and the frame part 72a are stacked on one another is simply referred to as a "stacking direction." The fixation member 72 fixes the refrigerant retention section 71 by sandwiching the refrigerant retention section 71 between the frame part 72a and the holding frame 80 in the stacking direction (the optical axis direction X).

An inner edge of the frame part 72a is disposed on the outer side of an inner edge of the refrigerant retention section 71. Therefore, a part of the refrigerant retention section 71, namely a portion on the inner side of the frame part 72a in the present embodiment, is exposed when viewed from the fixation member 72 side in the stacking direction.

As shown in FIG. 8 and FIG. 10, the attachment parts 72b are respectively provided to both end parts in the width direction Y in the both end parts in the vertical direction Z of the frame part 72a. The attachment parts 72b each project from the frame part 72a toward the holding frame 80 (+X side). The attachment parts 72b are respectively engaged with protrusions disposed on the side surfaces of the holding frame 80. Thus, the fixation member 72 is fixed to the holding frame 80.

The insertion parts 72c are disposed on both end parts in the vertical direction Z of the frame part 72a. The insertion parts 72b each project from the frame part 72a toward the holding frame 80 (+X side). The insertion parts 72c are respectively inserted in the insertion grooves 82a, 82b of the holding frame 80. The insertion parts 72c press the insertion parts 71b, 71c of the refrigerant retention section 71 inside the insertion grooves 82a, 82b, respectively.

The cooling promotion section 70 is provided to each of the plurality of light modulation units 4R, 4G, and 4B. In other words, the refrigerant retention section 71 and the fixation member 72 are provided to each of the plurality of light modulation units 4R, 4G, and 4B. As shown in FIG. 11, the refrigerant retention section 71G provided to the light modulation unit 4G out of the light modulation units 4R, 4G, and 4B is coupled to the refrigerant sender 50. In more detail, a coupling part 54 of the refrigerant sender 50 is coupled to lower end part of the refrigerant retention section 71G.

The refrigerant retention section 71B attached to the light modulation unit 4B and the refrigerant retention section 71R attached to the light modulation unit 4R are substantially the same as the refrigerant retention section 71G attached to the light modulation unit 4G except the point that the coupling part 54 is not coupled thereto.

In the present embodiment, there are provided junction parts 73a, 73b made of a porous material for coupling the refrigerant retention sections 71 provided to the plurality of light modulation units 4R, 4G, and 4B to each other. In the present embodiment, the refrigerant retention section 71B attached to the light modulation unit 4B and the refrigerant retention section 71R attached to the light modulation unit 4R are coupled to both sides of the refrigerant retention section 71G attached to the light modulation unit 4G via the junction parts 74a, 73b, respectively.

The junction part 73a couples the refrigerant retention section 71G attached to the light modulation unit 4G and the refrigerant retention section 71B attached to the light modulation unit 4B to each other. Thus, the refrigerant retention section 71B is coupled to the coupling part 54 of the refrigerant sender 50 via the refrigerant retention section 71G. As shown in FIG. 8, the junction part 73a is provided with a cover part 74 for covering the junction part 73a. The cover part 74 is, for example, a film made of resin.

The junction part 73b couples the refrigerant retention section 71 attached to the light modulation unit 4G and the refrigerant retention section 71 attached to the light modulation unit 4R to each other. Thus, the refrigerant retention section 71R is coupled to the coupling part 54 of the refrigerant sender 50 via the refrigerant retention section 71G. Although not shown in the drawings, the junction part 73b is also provided with the cover part 74 similarly to the junction part 73a.

The refrigerant W generated by the refrigerant generator 20 is transmitted to the refrigerant retention section 71G using the coupling part 54 of the refrigerant sender 50. The refrigerant W transmitted to the refrigerant retention section 71G is transmitted to the refrigerant retention section 71B via the junction part 73a, and is then transmitted to the refrigerant retention section 71R via the junction part 73b. In such a manner, the refrigerant W generated in the refrigerant generator 20 is transmitted to the three light modulation units 4R, 4G, and 4B. Then, the refrigerant W transmitted to and then retained in the refrigerant retention section 71 is evaporated, and thus, the light modulation units 4R, 4G, and 4B as the cooling target are cooled. In more detail, by the refrigerant W retained in the refrigerant retention section 71 evaporating, the holding frame 80 attached with the refrigerant retention section 71 is cooled, and by the holding frame 80 being cooled, the light modulators 4RP, 4GP, and 4BP held by the holding frame 80 are cooled. Thus, it is possible to cool the light modulators 4RP, 4GP, and 4BP as the cooling target with the cooler 10.

According to the present embodiment, it is possible for the cooler 10 to cool the cooling target by drawing heat from the cooling target using the evaporation of the refrigerant W as an endothermic reaction after transmitting the refrigerant W generated in the refrigerant generator 20 to the cooling target with the refrigerant sender 50. The cooling action by the evaporation of the refrigerant W can actively draw heat from the cooling target, and is therefore superior in cooling performance compared to when cooling the cooling target by mere heat transmission as in the case of air cooling or liquid cooling. Thus, when obtaining the same cooling performance as those of air cooling and liquid cooling, it is easy to reduce the entire size of the cooler compared to air cooling and liquid cooling.

Further, in the case of the cooling action by the evaporation of the refrigerant W, the cooling performance can be improved by increasing the surface area where the refrigerant W to be evaporated has contact with the cooling target. Therefore, even when raising the cooling performance obtained using the cooler 10, it is possible to suppress an increase in the sound noise. As described above, according to the present embodiment, it is possible to obtain the projector 1 equipped with the cooler 10 excellent in cooling performance, small in size, and excellent in quietness.

Further, according to the present embodiment, since the refrigerant W can be generated in the refrigerant generator 20, no time and effort for refilling the refrigerant W are necessary for the user, and thus, the convenience of the user can be enhanced. Further, since it is possible for the refrigerant generator 20 to control generation of the refrigerant W so as to generate necessary amount of refrigerant W when needed, it is not necessary to retain the refrigerant W in a reservoir tank or the like, and thus, it is possible to reduce the weight of the projector 1.

Further, according to the present embodiment, it is possible to absorb the steam included in the air AR1 fed by the moisture absorption/desorption member 40 from the first blower 60, and it is possible to release the moisture absorbed by the moisture absorption/desorption member 40 in the air AR2 fed by the second blower 23 as steam. Further, it is possible to generate the refrigerant W by condensing the moisture released as steam in the air AR2 using the first heat exchanger 30. Thus, according to the present embodiment, it is possible to generate the refrigerant W from the air in the projector 1.

Further, for example, when the humidity of the air AR2 fed from the second blower 23 to the first heat exchanger 30 is relatively low, the refrigerant W is difficult to be generated in some cases even when the first heat exchanger 30 is cooled in the refrigerant generator 20. The humidity of the air AR2 to be fed to the first heat exchanger 30 drops in some cases when, for example, the air outside the projector 1 is mixed with the air AR2. In such a case, the refrigerant generation efficiency of the refrigerant generator 20 decreases.

In contrast, according to the present embodiment, the refrigerant generator 20 has the circulation channel 27 that passes through the part of the moisture absorption/desorption member 40 located in the second area F2 and the first heat exchanger 30. Therefore, it is possible to prevent the air outside the projector 1 from entering the circulation channel 27 by substantially sealing the circulation channel 27, and it is easy to keep the humidity of the air AR2 fed to the first heat exchanger 30 in a relatively high state. Therefore, by cooling the first heat exchanger 30, it is possible to generate the refrigerant W in good condition. As a result, it is possible to prevent the refrigerant generation efficiency of the refrigerant generator 20 from degrading.

Further, according to the present embodiment, the first heat-transfer member 91 of the second heat exchanger 90 cools the air AR2 flowing through the circulation channel 27 to generate the refrigerant W. Therefore, it is possible to further condense the steam included in the air AR2, and it is possible to obtain a higher amount of refrigerant W in the refrigerant generator 20. Therefore, it is possible to improve the refrigerant generation efficiency of the refrigerant generator 20.

Further, according to the present embodiment, the second heat exchanger 90 performs cooling and heating of the air AR2 flowing through the circulation channel 27 using the thermoelectric element 93 having the heat absorption surface 93*a* and the heat dissipation surface 93*b*. Therefore, it is possible to reduce the energy for heating the air AR2, and it is possible to improve the refrigerant generation efficiency of the refrigerant generator 20. The detailed explanation will hereinafter be presented.

When the power is supplied to the thermoelectric element 93, the thermoelectric element 93 absorbs heat from the heat absorption surface 93*a* in accordance with the power supplied to cool the air AR2 in the circulation channel 27 via the first heat-transfer member 91. The thermoelectric element 93 releases the heat due to the power supplied and the heat absorbed from the air AR2 via the first heat-transfer member to the second heat-transfer member 92 from the heat dissipation surface 93*b*. Thus, the thermoelectric element 93 heats the air AR2 which has been cooled by the first heat-transfer member 91 via the fins 92*b* as the heat dissipation section of the second heat-transfer member 92.

Here, as described above, since the air AR2 includes the steam released from the moisture absorption/desorption member 40, when the air AR2 is cooled by the first heat-transfer member 91, the steam is condensed to generate the refrigerant W. Further, when the steam is condensed to generate the refrigerant W, a condensation heat is released. Therefore, the temperature of the air AR2 which has passed through the first heat-transfer member 91 becomes higher as much as the condensation heat thus released than when the heat is simply absorbed by the first heat-transfer member 91. Since the heat due to the power supplied and the heat absorbed from the air AR2 via the first heat-transfer member 91 are released to the air AR2 via the second heat-transfer member 92, it is possible for the second heat exchanger 90 to raise the temperature of the air AR2 as much as or even more than an amount corresponding to the power supplied to the thermoelectric element 93 as a result.

As an example, there is considered when the air AR2 at 40° C. is heated to 80° C. when it is necessary to provide the heat of 1 W to the air AR2 for raising the temperature of the air AR2 as much as 1° C. In this case, in an ordinary heater, it is necessary to supply the power of 40 W to the heater to release the heat of 40 W to the air AR2.

In contrast, in the present embodiment, by supplying the power of 30 W to the thermoelectric element 93, the heat of, for example, 20 W is absorbed from the air AR2 at 40° C. by the first heat-transfer member 91. On this occasion, when no condensation of the steam occurs, the temperature of the air AR2 drops to 20° C. However, since the steam is condensed to generate the refrigerant W, the condensation heat is released, and therefore, the temperature of the air AR2 does not drop to 20° C., but becomes, for example, 30° C.

The air AR2 at 30° C. having passed through the first heat-transfer member 91 is heated by the fins 92*b* as the heat dissipation section of the second heat-transfer member 92. On this occasion, the heat released from the fins 92*b* becomes the heat of 50 W which is a sum of the heat of 30 W due to the power supplied to the thermoelectric element 93 and the heat of 20 W absorbed from the air AR2 in the first heat-transfer member 91. Thus, the temperature of the air AR2 rises from 30° C. to 80° C. Therefore, while the power of 40 W is required for the ordinary heater, according to the present embodiment, it is possible to raise the temperature of the air AR2 from 40° C. to 80° C. by supplying the thermoelectric element 93 with the power of 30 W lower than 40 W.

As described hereinabove, according to the present embodiment, by raising the temperature of the air AR2 using the thermoelectric element 93 having the heat absorption surface 93*a* and the heat dissipation surface 93*b* to use the condensation heat in condensing the steam, it is possible to raise the temperature of the air AR2 with the lower energy compared to when simply using the heater. Therefore, it is possible to reduce the energy for heating the air AR2, and it is possible to improve the refrigerant generation efficiency of the refrigerant generator 20. It should be noted that the amount of heat [W] and the temperature [° C.] in the example described above are values varying with the configuration of the refrigerant generator 20 such as the thermoelectric element 93, and are not particularly limited.

Further, according to the present embodiment, in the first heat-transfer member 91, the fins 91b as the heat absorption section are disposed inside the first heat exchanger 30. Therefore, it is possible for the refrigerant sender 50 coupled to the first heat exchanger 30 to transmit the refrigerant W generated in the first heat-transfer member 91 to the light modulation units 4R, 4G, and 4B as the cooling target. Thus, it is possible to transmit the refrigerant W generated in the first heat-transfer member 91 without additionally providing another refrigerant sender, and it is possible to prevent the number of components of the projector 1 from increasing. Specifically, in the present embodiment, the refrigerant W generated in the first heat-transfer member 91 is transmitted to the light modulation units 4R, 4G, and 4B as the cooling target via the first trapping part 51, the third trapping part 53, the second trapping part 52, and the coupling part 54 in this order from the inside of the first lid part 32.

Further, according to the present embodiment, the first heat-transfer member 91 is the heatsink having the fins 91b as the heat absorption section. Therefore, it is possible to increase the area of the surface where the first heat-transfer member 91 has contact with the air AR2 due to the fins 91b, and thus, it is possible to make it easy to absorb the heat from the air AR2. Thus, it is easy to condense the air AR2 in the first heat-transfer member 91, and thus, it is possible to further generate the refrigerant W. Therefore, it is possible to further improve the refrigerant generation efficiency of the refrigerant generator 20.

Further, according to the present embodiment, the second heat-transfer member 92 is the heatsink having the fins 92b as the heat dissipation section. Therefore, it is possible to increase the area of the surface where the second heat-transfer member 92 has contact with the air AR2 due to the fins 92b, and thus, it is possible to make it easy to release the heat to the air AR2. Thus, it is possible to heat the air AR2 in good condition in the second heat-transfer member 92, and it is possible to increase the refrigerant generation efficiency in the refrigerant generator 20.

Further, according to the present embodiment, the fins 91b, 92b are each shaped like a plate extending along the direction in which the air AR2 passing through the second heat exchanger 90 flows inside the circulation channel 27. Therefore, it is difficult for the fins 91b, 92b to hinder the flow of the air AR2. Thus, it is possible to increase the area of the surface having contact with the air AR2 in the first heat-transfer member 91 and the second heat-transfer member 92 while preventing the flow of the air AR2 from being hindered inside the circulation channel 27. Therefore, it is possible to cool and heat the air AR2 by the second heat exchanger 90 in good condition while circulating the air AR2 inside the circulation channel 27 in good condition. Therefore, it is possible to further improve the refrigerant generation efficiency of the refrigerant generator 20.

Further, according to the present embodiment, there is provided the heat insulation member 94 for covering the base part 92a as the part exposed outside the circulation channel 27 out of the second heat-transfer member 92. Therefore, it is possible to prevent the heat which has been released from the heat dissipation surface 93b of the thermoelectric element 93 to the second heat-transfer member 92 from being released to the air located outside the circulation channel 27. Thus, it is possible for the second heat-transfer member 92 to release the heat having been released from the thermoelectric element 93 to the air AR2 inside the circulation channel 27 via the fins 92b in good condition. Therefore, it is possible to heat the air AR2 in good condition by the second heat-transfer member 92, and it is possible to further increase the refrigerant generation efficiency of the refrigerant generator 20.

It should be noted that in the present embodiment, it is also possible to adopt the configurations described below. In the following explanation, the constituents substantially the same as described above are arbitrarily denoted by the same reference symbols to thereby omit the description thereof in some cases.

First Modified Example

Figure 12:
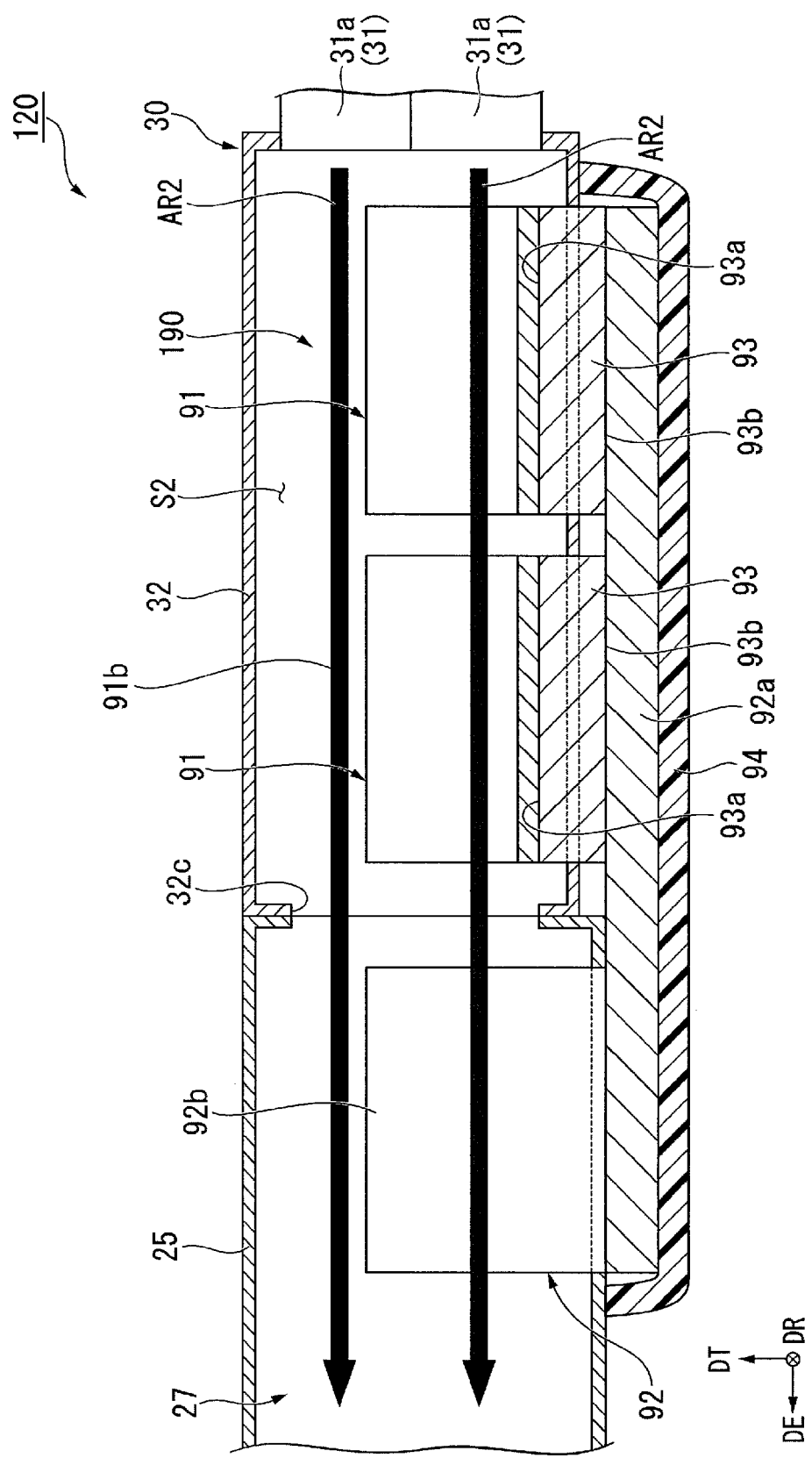
FIG. 12 is a cross-sectional view showing a part of a refrigerant generator in a first modified example of the embodiment.

FIG. 12 is a cross-sectional view showing a part of a refrigerant generator 120 in the present modified example. As shown in FIG. 12, in a second heat exchanger 190 of the refrigerant generator 120 in the present modified example, there is provided a plurality of thermoelectric elements 93. The plurality of thermoelectric elements 93 is arranged along the direction (the extension direction DE) in which the air AR2 passing through the second heat exchanger 190 flows inside the circulation channel 27. The heat dissipation surfaces 93b of the plurality of thermoelectric elements 93 are all thermally coupled to the base part 92a in the same second heat-transfer member 92. In the second heat exchanger 190 in the present modified example, the first heat-transfer member 91 is disposed for each of the thermoelectric elements 93. Therefore, the plurality of first heat-transfer members 91 is arranged along the direction (the extension direction DE) in which the air AR2 flows through the circulation channel 27. In FIG. 12, there are disposed two thermoelectric elements 93 and two first heat-transfer members 91, for example.

The heat absorption surfaces 93a in the plurality of thermoelectric elements 93 and the plurality of first heat-transfer members 91 are disposed inside the second space S2 of the first lid part 32 similarly to the embodiment described above. The rest of the configuration of the second heat exchanger 190 is substantially the same as the rest of the configuration of the second heat exchanger 90 in the embodiment described above. The rest of the configuration of the refrigerant generator 120 is substantially the same as the rest of the configuration of the refrigerant generator 20 in the embodiment described above.

According to the present modified example, there is disposed the plurality of thermoelectric elements 93. Therefore, it is easier to cool and heat the air AR2 inside the circulation channel 27 via the first heat-transfer members 91 and the second heat-transfer members 92 using the plurality of thermoelectric elements 93. Thus, it is possible to improve the refrigerant generation efficiency of the refrigerant generator 120.

Further, according to the present modified example, the plurality of thermoelectric elements 93 is arranged along the direction in which the air AR2 passing through the second heat exchanger 190 flows inside the circulation channel 27, and the first heat-transfer member 91 is disposed for each of the thermoelectric elements 93. Therefore, it is possible to arrange the plurality of first heat-transfer members 91 along the direction in which the air AR2 flows inside the circulation channel 27, and thus, it is possible to elongate the distance of the area where the air AR2 has contact with the first heat-transfer members 91. Thus, it is easier to cool the air AR2 using the first heat-transfer members 91, and thus, it is possible to generate a larger amount of the refrigerant W. Therefore, it is possible to further improve the refrigerant generation efficiency of the refrigerant generator 120.

Second Modified Example

Figure 13:
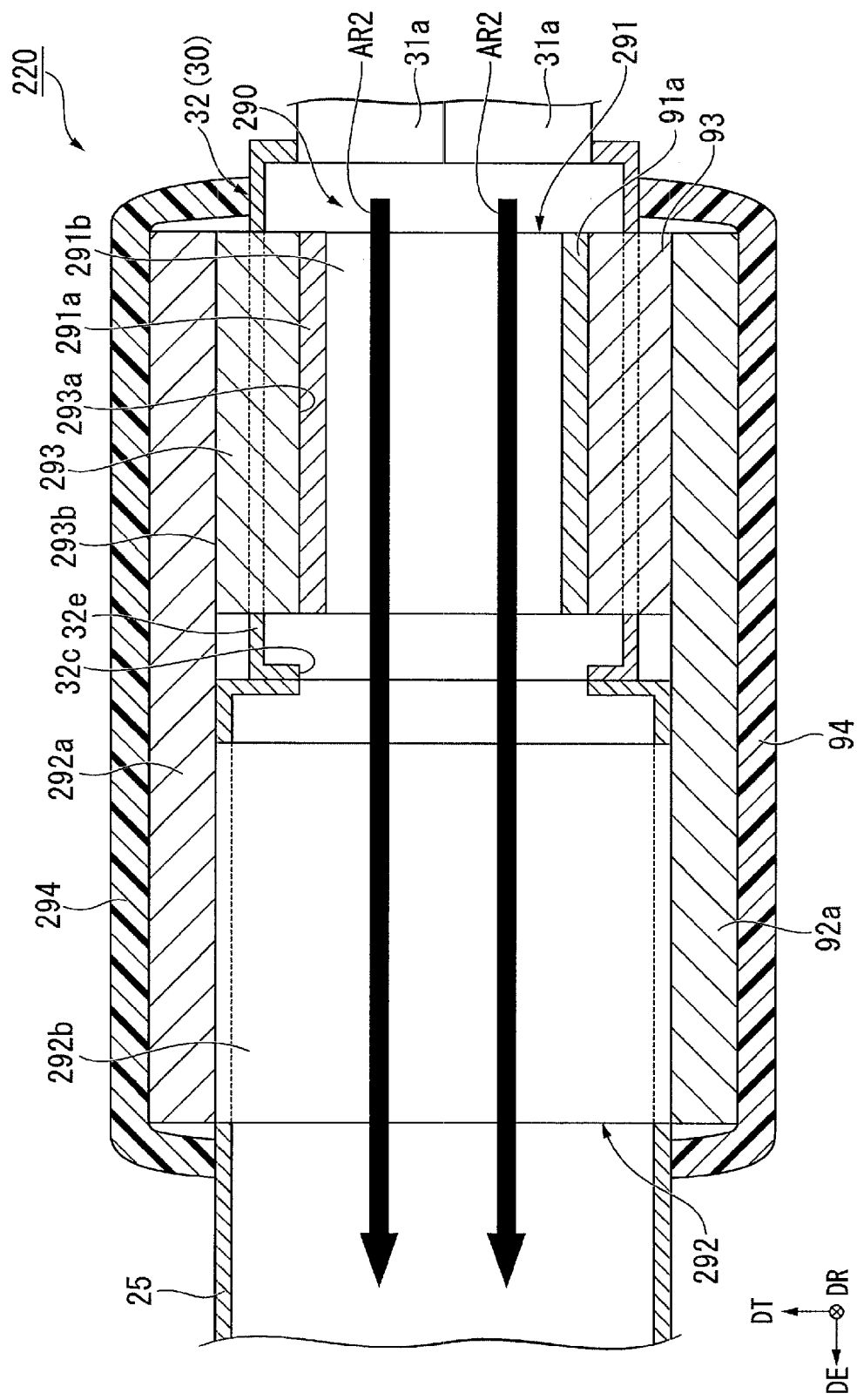
FIG. 13 is a cross-sectional view showing a part of a refrigerant generator in a second modified example of the embodiment.

FIG. 13 is a cross-sectional view showing a part of a refrigerant generator 220 according to the present modified example. As shown in FIG. 13, in the second heat exchanger 290 of the refrigerant generator 220, there is disposed a thermoelectric element 293 (a second thermoelectric element) in addition to the thermoelectric element 93 (a first thermoelectric element). The thermoelectric element 93 and the thermoelectric element 293 are disposed so as to sandwich the first heat-transfer member 291 in the thickness direction DT. In other words, in the present modified example, the second heat-exchange section 290 has the thermoelectric element 93 and the thermoelectric element 293 disposed so as to sandwich the first heat-transfer member 291 in a direction perpendicular to the direction in which the air AR2 passing through the second heat exchanger 290 flows inside the circulation channel 27.

The thermoelectric element 293 is disposed symmetrically in the thickness direction DT with the thermoelectric element 93. In other words, the heat absorption surface 293a of the thermoelectric element 293 is a surface on the other side (−DT side) in the thickness direction DT, and the heat dissipation surface 293b is a surface on the one side (+DT side) in the thickness direction DT. The thermoelectric element 293 is disposed so as to penetrate a wall part 32e on the one side in the thickness direction DT of the first lid part 32 in the thickness direction DT. The rest of the configuration of the thermoelectric element 293 is substantially the same as the rest of the configuration of the thermoelectric element 93.

The first heat-transfer member 291 has the base part 91a, a base part 291a, and a plurality of fins (the heat absorption section) 291b. The base part 91a and the base part 291a are respectively coupled to both end parts in the thickness direction DT of the plurality of fins 291b. In other words, the base part 91a and the base part 291a are coupled to each other with the plurality of fins 291b.

The base part 291a is fixed so as to have contact with the heat absorption surface 293a of the thermoelectric element 293. Thus, both of the heat absorption surface 93a of the thermoelectric element 93 and the heat absorption surface 293a of the thermoelectric element 293 are thermally coupled to the first heat-transfer member 291 sandwiched by the pair of thermoelectric elements 93, 293. The base part 291a is substantially the same in configuration as the base part 91a except the point that the base part 291a is disposed symmetrically in the thickness direction DT with the base part 91a. The rest of the configuration of the fins 291b is substantially the same as the rest of the configuration of the fins 91b in the embodiment described above.

The second heat-transfer member 292 in the present modified example has the base part 92a, a base part 292a, and a plurality of fins (the heat dissipation section) 292b. The base part 92a and the base part 292a are respectively coupled to both end parts in the thickness direction DT of the plurality of fins 292b. In other words, the base part 92a and the base part 292a are coupled to each other with the plurality of fins 292b.

The base part 292a is fixed so as to have contact with the heat dissipation surface 293b of the thermoelectric element 293. The base part 292a is substantially the same in configuration as the base part 92a except the point that the base part 292a is disposed symmetrically in the thickness direction DT with the base part 92a. The base part 292a is covered with a heat insulation member 294 from the one direction side (+DT side) in the thickness direction DT. The heat insulation member 294 is substantially the same in configuration as the heat insulation member 94 except the point that the heat insulation member 294 is symmetrical in the thickness direction DT with the heat insulation member 94. The rest of the configuration of the fins 292b is substantially the same as the rest of the configuration of the fins 92b in the embodiment described above. The rest of the configuration of the second heat exchanger 290 is substantially the same as the rest of the configuration of the second heat exchanger 90 in the embodiment described above. The rest of the configuration of the refrigerant generator 220 is substantially the same as the rest of the configuration of the refrigerant generator 20 in the embodiment described above.

According to the present modified example, the second heat exchange part 290 has the thermoelectric element 93 and the thermoelectric element 293 disposed so as to sandwich the first heat-transfer member 291 in the direction perpendicular to the direction in which the air AR2 passing through the second heat exchanger 290 flows inside the circulation channel 27, and both of the heat absorption surface 93a of the thermoelectric element 93 and the heat absorption surface 293a of the thermoelectric element 293 are thermally coupled to the first heat-transfer member 291 sandwiched by the pair of thermoelectric elements 93, 293. Therefore, it is possible to arrange the plurality of thermoelectric elements 93, 293 while preventing the size of the second heat exchanger 290 from increasing in the direction (the extension direction DE) in which the air AR2 inside the circulation channel 27 flows. Thus, it is possible to improve the refrigerant generation efficiency of the refrigerant generator 220 using the plurality of thermoelectric elements 93, 293 while preventing the refrigerant generator 220 from growing in size.

Further, it is also possible to adopt the configuration described below besides the modified examples described above.

The refrigerant generator can also be a refrigerant generator 320 having a heater 322 represented by dashed-two dotted lines in FIG. 3. The heater 322 is disposed in a part where the air AR2 flowing from the first heat exchanger 30 to the moisture absorption/desorption member 40 in the circulation channel 27. In FIG. 3, the heater 322 is disposed inside the first circulation duct 25. The heater 322 is disposed downstream of the second heat exchanger 90 in the flow direction of the air AR2 flowing through the first circulation duct 25. The heater 322 further heats the air AR2 which has been heated by the fins 92b as the heat dissipation section of the second heat exchanger 90. The heater 322 is not particularly limited providing the heater 322 is capable of heating the air AR2. The heater 322 can be, for example, an electric heater, or can also be a heatsink heated by a heater not shown.

According to this configuration, the air AR2 can also be heated by the heater 322 in addition to the second heat exchanger 90. Therefore, the moisture absorption/desorption member 40 can be heated by air AR2 in better condition, and it is possible to evaporate the moisture absorbed by the moisture absorption/desorption member 40 in good condition. Thus, it is possible to release the moisture having been absorbed by the moisture absorption/desorption member 40 to the air AR2 in good condition. Therefore, it is possible to further improve the refrigerant generation efficiency of the refrigerant generator 320.

The first heat-transfer member is not particularly limited providing the first heat-transfer member is coupled to the heat absorption surface of the thermoelectric element, and is capable of cooling the air flowing through the circulation channel to generate the refrigerant. The heat absorption section of the first heat-transfer member can also be disposed inside the circulation section 31 in the embodiment described above. Further, the heat absorption section of the first heat-transfer member can also be disposed in a part where the air flowing from the first heat exchanger to the moisture absorption/desorption member in the circulation channel 27. Specifically, it is possible for the heat absorption section of the first heat-transfer member to be disposed inside the first circulation duct 25 in the embodiment described above. Further, the heat absorption section of the first heat-transfer member can also be disposed in a part where the air flowing from the moisture absorption/desorption member to the first heat exchanger in the circulation channel 27. Specifically, it is possible for the heat absorption section of the first heat-transfer member to be disposed inside the second circulation duct 26 in the embodiment described above. The other parts than the heat absorption section of the first heat-transfer member can be disposed outside the circulation channel. The heat absorption section is not required to be the fins.

The second heat-transfer member is not particularly limited providing the heat dissipation section is disposed in the position through which the air flowing from the first heat exchanger to the moisture absorption/desorption member passes in the circulation channel, and the air having been cooled by the first heat-transfer member can be heated. The second heat-transfer member can wholly be disposed inside the circulation channel. The heat dissipation section of the second heat-transfer member is not required to be the fins.

In the first modified example described above, the numbers of the thermoelectric elements 93 and the first heat-transfer members 91 arranged side by side are not particularly limited, and can also be equal to or larger than three. It is also possible to dispose the two thermoelectric elements 93, 293 sandwiching the first heat-transfer member 91 in the thickness direction DT as described in the second modified example with respect to each of the first heat-transfer members 91 in the first modified example described above. The heat insulation member is not required to be disposed.

The configuration of the refrigerant sender is not limited to the configuration of the embodiment described above. The refrigerant sender is not particularly limited providing the refrigerant sender can transmit the refrigerant to the cooling target. It is also possible for the refrigerant sender to have a pump for transmitting the refrigerant, and a pipe through which the refrigerant transmitted by the pump passes. Further, it is also possible for the refrigerant sender to transmit the refrigerant to the cooling target using, for example, a gravitational force. Further, it is also possible to dispose a refrigerant sender coupled to the first heat-transfer member of the second heat exchanger besides the refrigerant sender coupled to the first heat exchanger.

The configuration of the cooling promotion section is not limited to the configuration of the embodiment described above. The cooling promotion section is not particularly limited providing the cooling promotion section can promote cooling of the cooling target by the refrigerant having been transmitted to the cooling target. For example, the refrigerant retention section of the cooling promotion section can also be fine asperity formed by a treatment or the like on the surface of the cooling target. In this case, the refrigerant is retained by the asperity. Further, the refrigerant retention section can be a hydrophilic coat or the like disposed on the surface of the cooling target.

In each of the embodiments described above, it is assumed that the cooling target is the light modulation units, but this is not a limitation. The cooling target can include at least one of the light modulator, the light modulation units, the light source device, a wavelength conversion element for converting the wavelength of the light emitted from the light source device, a diffusion element for diffusing the light emitted from the light source device, and a polarization conversion element for converting the polarization direction of the light emitted from the light source device. According to this configuration, it is possible to cool each of the constituents of the projector in a similar manner as described above.

Although in the embodiment described above, there is described the example when applying the present disclosure to the transmissive projector, the present disclosure can also be applied to a reflective projector. Here, "transmissive" denotes that the light modulator including the liquid crystal panel and so on is a type of transmitting the light. Further, "reflective" denotes that the light modulator is a type of reflecting the light. It should be noted that the light modulator is not limited to the liquid crystal panel or the like, but can also be a light modulator using, for example, micromirrors.

Although in the embodiment described above, there is cited the example of the projector using three light modulators, the present disclosure can also be applied to a projector using one light modulator alone or a projector using four or more light modulators.

The constituents described above can arbitrarily be combined with each other within a range in which the constituents do not conflict with each other.

What is claimed is:
1. A projector having a cooling target, comprising:
    a light source configured to emit light;
    a light modulator for modulating light emitted from the light source in accordance with an image signal;
    a projection optical device configured to project the light modulated by the light modulator; and
    a cooler configured to cool the cooling target based on transformation of a refrigerant into a gas, wherein:
    the cooler includes
        a refrigerant generator configured to generate the refrigerant, and
        a refrigerant sender configured to transmit the refrigerant generated toward the cooling target,
    the refrigerant generator includes
        a moisture absorption/desorption member which rotates,
        a first blower configured to feed air to a part of the moisture absorption/desorption member located in a first area,
        a first heat exchanger coupled to the refrigerant sender,
        a circulation channel passing through the first heat exchanger and a part of the moisture absorption/desorption member located in a second area different from the first area,
        a second blower configured to circulate air in the circulation channel, and a second heat exchanger at least partially disposed in a part where air passes from the first heat exchanger to the moisture absorption/desorption member in the circulation channel, the first heat exchanger is cooled to generate the refrigerant from the air flowed into the first heat exchanger, the second heat exchanger includes
- a thermoelectric element having a heat absorption surface and a heat dissipation surface,
- a first heat-transfer member thermally coupled to the heat absorption surface, and
- a second heat-transfer member thermally coupled to the heat dissipation surface, the first heat-transfer member cools the air flowing through the circulation channel to generate the refrigerant, and the second heat-transfer member has a heat dissipation section configured to heat air which was cooled by the first heat-transfer member.

2. The projector according to claim 1, wherein:
the first heat-transfer member has a heat absorption section configured to cool the air flowing through the circulation channel, and
the heat absorption section is disposed inside the first heat exchanger.

3. The projector according to claim 2, wherein
the first heat-transfer member is a heatsink having a plurality of fins which is the heat absorption section.

4. The projector according to claim 1, wherein
the second heat-transfer member is a heatsink having a plurality of fins which is the heat dissipation section.

5. The projector according to claim 3, wherein
the plurality of fins is each shaped like a plate extending along a direction in which the air passes through the second heat exchanger inside the circulation channel.

6. The projector according to claim 4, wherein
the plurality of fins is each shaped like a plate extending along a direction in which the air passes through the second heat exchanger inside the circulation channel.

7. The projector according to claim 1, wherein
the second heat exchanger has a plurality of the thermoelectric elements.

8. The projector according to claim 7, wherein:
the plurality of thermoelectric elements is arranged along the direction in which the air passes through the second heat exchanger inside the circulation channel, and
the first heat-transfer member is disposed for each of the thermoelectric elements.

9. The projector according to claim 7, wherein:
the second heat exchanger includes a first thermoelectric element and a second thermoelectric element which are disposed so as to sandwich the first heat-transfer member in a direction perpendicular to the direction in which the air passes through the second heat exchanger inside the circulation channel, and
both of the heat absorption surface of the first thermoelectric element and the heat absorption surface of the second thermoelectric element are thermally coupled to the first heat-transfer member sandwiched between the first thermoelectric element and the second thermoelectric element.

10. The projector according to claim 1, wherein:
the refrigerant generator has a heater disposed in a part where air flowing from the first heat exchanger to the moisture absorption/desorption member passes in the circulation channel, and
the heater further heats the air which was heated by the heat dissipation section.

11. The projector according to claim 1, wherein
the cooling target is the light modulator.

* * * * *